(12) United States Patent
Kuramoto et al.

(10) Patent No.: US 8,989,228 B2
(45) Date of Patent: Mar. 24, 2015

(54) LASER DIODE DEVICE, METHOD OF DRIVING THE SAME, AND LASER DIODE APPARATUS

(75) Inventors: Masaru Kuramoto, Kanagawa (JP); Tomoyuki Oki, Kanagawa (JP); Tomoya Sugahara, Kanagawa (JP); Hiroyuki Yokoyama, Miyagi (JP)

(73) Assignees: Sony Corporation, Tokyo (JP); Tohoku University, Miyagi (JP)

( * ) Notice: Subject to any disclaimer, the term of this patent is extended or adjusted under 35 U.S.C. 154(b) by 133 days.

(21) Appl. No.: 12/828,403

(22) Filed: Jul. 1, 2010

(65) Prior Publication Data

US 2011/0007765 A1    Jan. 13, 2011

(30) Foreign Application Priority Data

Jul. 9, 2009    (JP) .................. 2009-162617

(51) Int. Cl.
*H01S 5/00* (2006.01)
*H01S 5/062* (2006.01)
*B82Y 20/00* (2011.01)
(Continued)

(52) U.S. Cl.
CPC ............ *H01S 5/06216* (2013.01); *B82Y 20/00* (2013.01); *H01S 5/0602* (2013.01); *H01S 5/06253* (2013.01); *H01S 5/2009* (2013.01); *H01S 5/34333* (2013.01)
USPC .............. 372/45.01; 372/45.012; 372/46.01

(58) Field of Classification Search
CPC  H01S 5/2009; H01S 5/06216; H01S 5/34333
USPC ............................. 372/45.01, 45.012, 46.01
See application file for complete search history.

(56) References Cited

U.S. PATENT DOCUMENTS 3,953,809 A * 4/1976 Kawamoto et al. ............. 372/26
6,292,500 B1   9/2001 Kouchi et al.
(Continued)

FOREIGN PATENT DOCUMENTS

JP    01-281782    11/1989
JP    06-169124    6/1994
(Continued)

OTHER PUBLICATIONS

Japanese Office Examination issued in connection with related Japanese patent application No. JP 2013-139507 dated Jun. 17, 2014, 3 pages.
(Continued)

*Primary Examiner* — Tod T Van Roy
(74) *Attorney, Agent, or Firm* — Dentons US LLP

(57) ABSTRACT

An ultrashort pulse and ultrahigh power laser diode device capable of outputting pulse laser light having higher peak power with a simple composition and a simple structure is provided. The laser diode device includes: a laminated structure composed of a first compound semiconductor layer containing n-type impurity, an active layer having a quantum well structure, and a second compound semiconductor layer containing p-type impurity; a first electrode electrically connected to the first compound semiconductor layer; and a second electrode electrically connected to the second compound semiconductor layer, wherein the second compound semiconductor layer is provided with an electron barrier layer having a thickness of $1.5 \times 10^{-8}$ m or more, and driving is made by a pulse current having a value 10 or more times as large as a threshold current value.

20 Claims, 20 Drawing Sheets

(51) Int. Cl.
*H01S 5/06* (2006.01)
*H01S 5/0625* (2006.01)
*H01S 5/20* (2006.01)
*H01S 5/343* (2006.01)

(56) References Cited

U.S. PATENT DOCUMENTS

| 6,635,905 | B2 | 10/2003 | Nido et al. | |
|---|---|---|---|---|
| 2004/0120363 | A1 | 6/2004 | Siepmann | |
| 2007/0009000 | A1* | 1/2007 | Tanaka et al. | 372/45.01 |
| 2008/0117945 | A1* | 5/2008 | Kuramoto | 372/45.011 |
| 2009/0022195 | A1* | 1/2009 | Kuramoto | 372/45.01 |
| 2009/0175305 | A1* | 7/2009 | Kohda | 372/44.01 |
| 2009/0180505 | A1* | 7/2009 | Kohda et al. | 372/43.01 |

FOREIGN PATENT DOCUMENTS

| JP | 08-162709 | 6/1996 |
|---|---|---|
| JP | 10-229252 | 8/1998 |
| JP | 11-068226 | 3/1999 |
| JP | 11-232680 | 8/1999 |
| JP | 11-340580 | 12/1999 |
| JP | 2003-060290 | 2/2003 |
| JP | 2003-086887 | 3/2003 |
| JP | 2003-086903 | 3/2003 |
| JP | 2003-264343 | 9/2003 |
| JP | 2005-005452 | 1/2005 |
| JP | 2005-039099 | 2/2005 |
| JP | 2007-103669 | 4/2007 |
| JP | 2007-235107 | 9/2007 |
| JP | 2008-187034 | 8/2008 |
| JP | 2008-258456 | 10/2008 |
| JP | 2008-277539 | 11/2008 |
| JP | 2009-094360 | 4/2009 |
| JP | 2008-166372 | 1/2010 |
| JP | 2008-226007 | 3/2010 |
| JP | 2009-034004 | 9/2010 |
| JP | 2009-155208 | 11/2010 |

OTHER PUBLICATIONS

Japanese Office Examination issued in connection with related Japanese patent application No. JP 2009-162617 dated Jul. 8, 2014, 7 pages.

Japanese Office Examination issued in connection with related Japanese patent application No. JP 2009-162617 dated Jul. 8, 2014, 2 pages.

Japanese Office Examination Report issued in connection with related Japanese Patent Application No. JP 2013-139507 dated Jan. 20, 2015.

* cited by examiner

LASER DIODE DEVICE, METHOD OF DRIVING THE SAME, AND LASER DIODE APPARATUS

BACKGROUND OF THE INVENTION

1. Field of the Invention

The present invention relates to a laser diode device, a method of driving the same, and a laser diode apparatus.

2. Description of the Related Art

In these years, in the advanced scientific region researches using laser light with the pulse time on the attosecond time scale or on the femtosecond time scale, ultrashort pulse and ultrahigh power laser is actively used. As the ultrashort pulse and ultrahigh power laser, for example, titanium/sapphire laser is known. Such a titanium/sapphire laser is an expensive and large solid laser light source, which is a main factor to inhibit spread of the technology. If the ultrashort pulse and ultrahigh power laser is realized with the use of a laser diode, substantial miniaturization, price reduction, and high stability are able to be realized, which is expected to become a breakthrough for generalizing advanced scientific technology in this field.

Meanwhile, short pulsation of the laser diode has been actively researched since 1960s in the communication system field. As a method of generating short pulses in the laser diode, gain switching method, loss switching method (Q switching method), and mode locking method are known. In these methods, high output is pursued by combining the laser diode with a diode amplifier, a nonlinear optical device, an optical fiber and the like.

SUMMARY OF THE INVENTION

Of the foregoing methods, in the gain switching method as the simplest method, by driving the laser diode by a short pulse current, a light pulse having a pulse width of about from 20 picosecond to 100 picosecond both inclusive is able to be generated (for example, refer to J. Ohya et al., Appl. Phys. Lett. 56 (1990) 56. as Nonpatent document 1, J. AuYeung et al., Appl. Phys. Lett. 38 (1981) 308. as Nonpatent document 2, N. Yamada et al., Appl. Phys. Lett. 63 (1993) 583. as Nonpatent document 3, J. E. Ripper et al., Appl. Phys. Lett. 12 (1968) 365. as Nonpatent document 4, and "Ultrafast diode lasers," P. Vasil'ev, Artech House Inc., 1995 as Nonpatent document 5). In the gain switching method, since a commercially available laser diode is just driven by a short pulse current, a picosecond class short pulse light source is able to be realized by a significantly simple equipment structure. However, the peak output of the light pulse is about from 0.1 watt to 1 watt both inclusive in a 850 nm band AlGaAs laser diode, and is about from 10 milliwatt to 100 milliwatt both inclusive in a 1.5 μm band InGaAsP laser diode. Thus, as a light source necessary for a high peak output used for, for example, two-photon absorption, the light output is not sufficient. Therefore, in order to increase the peak output, a complicated and difficult structure in which, for example, mode locking method is combined with a diode amplifier or an optical fiber amplifier is necessitated.

In the past, in the AlGaAs laser diode device, with the use of three-electrode type passive Q-S method, peak power of 10 watt, light pulse width of 5 picosecond, and energy per 1 pulse of 50 picojoule have been obtained (refer to Peter P., Vasil' EV IEEE Journal of Quantum Electronics Vol. 24 No. 12, p. 2386 (1988) as Nonpatent document 6). Further, in a GaN laser diode device, with the use of strong excitation gain switching method, peak power of 12 watt, light pulse width of 10 picosecond, and energy per 1 pulse of 120 picojoule have been obtained (refer to S. Kono, et al, "12W peak-power 10 ps duration optical pulse generation by gain switching of a single-transverse-mode GaInN blue laser diode," Applied Physics Letters 93, 131113 (2008) as Nonpatent document 7).

As described above, regarding an example that a high output is pursued based on "all semiconductor" as an essential requirement for realizing ultimate miniaturization, that is, regarding a laser diode apparatus that does not need mechanical parts or optical parts but is composed of only a laser diode or a combination of a laser diode and a semiconductor device, almost no report exists particularly in a 405 nm band laser diode composed of GaN compound semiconductor. However, if "all semiconductor" pulse laser having a high peak output is able to be realized in 405 nm band, such a pulse laser is able to be used as a light source of a stacked volumetric optical disc system expected as a next generation optical disc system after the Blu-ray optical disc system. In addition, a simple and convenient ultrashort pulse and ultrahigh power light source covering all wavelength bands in the visible light range is able to be realized, and a light source requested in the medical field, the bio imaging field and the like is able to be provided. Further, in the nanoengineered field, it is expected to obtain a highly fine processing equipment.

Further, in the foregoing Nonpatent document 6 and the foregoing Nonpatent document 7, a laser diode device having high peak power is disclosed. However, it is strongly demanded to realize a laser diode device capable of outputting pulse laser light having higher peak power.

Accordingly, in the invention, it is desirable to provide an ultrashort pulse and ultrahigh power laser diode device capable of outputting pulse laser light having higher peak power with a simple composition and a simple structure, a method of driving the same, and a laser diode apparatus mounting such a laser diode device.

According to a first aspect or a second aspect of the invention to attain the foregoing object, there is provided a laser diode device, a laser diode device in a method of driving the laser diode device, or a laser diode device composing a laser diode apparatus. The laser diode device includes A. a laminated structure composed of a first compound semiconductor layer containing n-type impurity, an active layer having a quantum well structure, and a second compound semiconductor layer containing p-type impurity, B. a first electrode electrically connected to the first compound semiconductor layer, and C. a second electrode electrically connected to the second compound semiconductor layer. The second compound semiconductor layer is provided with an electron barrier layer having a thickness of $1.5*10^{-8}$ m (15 nm) or more. The laser diode device having such a structure will be hereinafter referred to as "laser diode device of the like of the invention" in some cases. The upper limit of the thickness of the electron barrier layer may be determined as appropriate by performing various tests based on increase of a drive voltage, strain generation state in the second compound semiconductor layer and the like.

The laser diode device according to the first aspect of the invention is driven by a pulse current having a value 10 or more times as large as the threshold current value $I_{th}$, preferably 20 or more times as large as the threshold current value $I_{th}$, and more preferably 50 or more times as large as the threshold current value $I_{th}$. The laser diode device according to the second aspect of the invention is driven by a pulse voltage having a value twice or more as large as a threshold voltage value $V_{th}$, preferably 4 or more times as large as the threshold voltage value $V_{th}$, and more preferably 10 or more times as large as the threshold voltage value $V_{th}$.

In the method of driving a laser diode device according to the first aspect of the invention, as described above, the laser diode device is composed of the laser diode device or the like of the invention, and the laser diode device is driven by a pulse current having a value 10 or more times as large as the threshold current value $I_{th}$, preferably 20 or more times as large as the threshold current value $I_{th}$, and more preferably 50 or more times as large as the threshold current value $I_{th}$. In the method of driving a laser diode device according to the second aspect of the invention, as described above, the laser diode device is composed of the laser diode device or the like of the invention, and the laser diode device is driven by a pulse voltage having a value twice or more as large as a threshold voltage value $V_{th}$, preferably 4 or more times as large as the threshold voltage value $V_{th}$, and more preferably 10 or more times as large as the threshold voltage value $V_{th}$.

Further, the laser diode apparatus according to the first aspect of the invention is a laser diode apparatus including a pulse generator and a laser diode device driven by a drive pulse from the pulse generator. The laser diode device is composed of the laser diode device or the like of the invention as described above, and the laser diode device is driven by a pulse current having a value 10 or more times as large as the threshold current value $I_{th}$, preferably 20 or more times as large as the threshold current value $I_{th}$, and more preferably 50 or more times as large as the threshold current value $I_{th}$. The laser diode apparatus according to the second aspect of the invention is a laser diode apparatus including a pulse generator and a laser diode device driven by a drive pulse from the pulse generator. The laser diode device is composed of the laser diode device or the like of the invention as described above, and the laser diode device is driven by a pulse voltage having a value twice or more as large as a threshold voltage value $V_{th}$, preferably 4 or more times as large as the threshold voltage value $V_{th}$, and more preferably 10 or more times as large as the threshold voltage value $V_{th}$.

Where the threshold current value $I_{th}$ represents a current flown into a laser diode device when laser oscillation is started, the threshold voltage value $V_{th}$ represents a voltage applied to the laser diode device at this time, and an internal resistance of the laser diode device is R ($\Omega$), the following formula is established:

$$V_{th} = R*I_{th} + V_0$$

$V_0$ represents a built-in potential of p-n junction.

In the laser diode device or the method of driving the same according to the first aspect or the second aspect of the invention or the laser diode apparatus according to the first aspect or the second aspect of the invention, the second compound semiconductor layer is provided with the electron barrier layer having a thickness of $1.5*10^{-8}$ m or more. In the laser diode device or the method of driving the same according to the first aspect of the invention and the laser diode apparatus according to the first aspect of the invention, the laser diode device is driven by a pulse current having a value 10 or more times as large as the threshold current value $I_{th}$. In the laser diode device or the method of driving the same according to the second aspect of the invention and the laser diode apparatus according to the second aspect of the invention, the laser diode device is driven by a pulse voltage having a value twice or more as large as a threshold voltage value $V_{th}$. In result, an ultrashort pulse and ultrahigh power laser diode device that outputs laser light having 70 watt or more peak power was able to be obtained. By combining the laser diode device with a commercially available electric drive electronics, a laser diode apparatus (laser light source) having watt level or more peak light intensity is able to be easily obtained.

Other and further objects, features and advantages of the invention will appear more fully from the following description.

DETAILED DESCRIPTION OF THE PREFERRED EMBODIMENTS

Figure 1A:
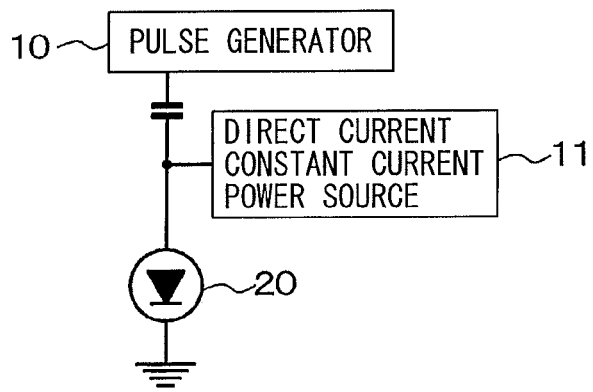
FIG. 1A and FIG. 1B are circuit diagrams of a laser diode apparatus of a first embodiment.

While the invention will be hereinafter described based on embodiments with reference to the drawings, the invention is not limited to the embodiments, and various numerical values and materials in the embodiments are exemplification. The description will be given in the following order:
1. A laser diode device, a method of driving the same, and a laser diode apparatus of the invention and overall description
2. First embodiment (laser diode device, a method of driving the same, and a laser diode apparatus)
3. Second embodiment (modification of the first embodiment)
4. Third embodiment (another modification of the first embodiment and others)

A laser diode device, a method of driving the same, and a laser diode apparatus of the invention and overall description In a laser diode device or the like of the invention, a distance (d) from an electron barrier layer to an active layer may be $8*10^{-8}$ m (80 nm) or less. "The distance (d) from the electron barrier layer to the active layer" means a distance between a section of the electron barrier layer facing the active layer (interface layer) and a section of the active layer facing the electron barrier layer (interface layer). The distance (d) from the electron barrier layer to the active layer may be "0." That is, the electron barrier layer may be contacted with the active layer. The electron barrier layer is also referred to as a cap layer or an evaporation preventive layer. The electron barrier layer is a layer provided for reflecting electrons from a first compound semiconductor layer containing n-type impurity, and for preventing the electrons from penetrating through a second compound semiconductor layer, that is, for preventing electron overflow. By setting the distance (d) from the electron barrier layer to the active layer to $8*10^{-8}$ m (80 nm) or less, electron barrier is able to be inhibited from being lowered due to bend of energy band in injecting a high current, and the effective barrier height in the electron barrier layer is able to be increased.

In a laser diode device or the like of the invention including the foregoing preferred form, the active layer may be composed of a carrier injection region and a carrier non-injection region. Such a structure is referred to as "first structure laser diode device" for convenience. The first structure laser diode device is categorized as a kind of multi-section (multi-region) laser diode device in which the carrier injection region (light emitting region, gain region) and the carrier non-injection region (saturable absorption region) are apposed in a direction in which a resonator is extended (hereinafter referred to as "resonator direction" in some cases). Examples of arrangement state of the carrier injection region and the carrier non-injection region include the following:
1. Arrangement state in which N pieces of the carrier injection region and (N-1) pieces of the carrier non-injection region are provided, and the carrier injection regions sandwich the carrier non-injection region.
2. Arrangement state in which N pieces of the carrier non-injection region and (N-1) pieces of the carrier injection region are provided, and the carrier non-injection regions sandwich the carrier injection region.

For example, it is possible that high resistance is obtained by injecting ions such as boron (B), aluminum (Al), and silicon (Si) into a section of the second compound semiconductor layer positioned above the carrier non-injection region. In the following description, the resonator direction is called X direction and thickness direction of a laminated structure is called Z direction.

Further, in a laser diode device or the like of the invention including the foregoing preferred form, the length of a second electrode may be shorter than the length of the active layer. Such a structure is referred to as "second structure laser diode device" for convenience. The number of the second electrode may be one, or the second electrode may be divided into a plurality of sections. The second structure laser diode device is also categorized as a kind of multi-section laser diode device in which the light emitting region (a section of the active layer positioned directly below the second electrode) and the saturable absorption region (a section of the active layer other than the section of the active layer positioned directly below the second electrode) are apposed in the resonator direction. Examples of arrangement state of the light emitting region and the saturable absorption region include the following:
1. Arrangement state in which N pieces of the light emitting region and (N-1) pieces of the saturable absorption region are provided, and the light emitting regions sandwich the saturable absorption region.
2. Arrangement state in which N pieces of the saturable absorption region and (N-1) pieces of the light emitting region are provided, and the saturable absorption regions sandwich the light emitting region.

By adopting the foregoing structure 2, damage on a light outputting end face of the laser diode device is hardly generated. It is possible that high resistance is obtained by injecting ions such as boron (B), aluminum (Al), and silicon (Si) into a section of the second compound semiconductor layer positioned above the saturable absorption region.

Further, in a laser diode device or the like of the invention including the foregoing preferred form, the second electrode may be separated into a first section and a second section by a separation trench. Such a structure is referred to as "third structure laser diode device" for convenience. By applying a pulse current or a pulse voltage to the first section of the second electrode, laser oscillation is generated. The width of the separation trench is desirably 1 μm or more and 50% or less of a resonator length, or more preferably 10 μm or more and 10% or less of the resonator length, but the width of the separation trench is not limited thereto.

The third structure laser diode device is also categorized as a kind of multi-section laser diode device in which the light emitting region (a section of the active layer positioned directly below the first section of the second electrode) and the saturable absorption region (a section of the active layer positioned directly below the second section of the second electrode) are apposed in the resonator direction. An electric resistance value between the first section and the second section of the second electrode is desirably $1*10^2 \Omega$ or more, preferably $1*10^3 \Omega$ or more, and more preferably $1*10^4 \Omega$ or more. Otherwise, the electric resistance value between the first section and the second section of the second electrode is desirably $1*10$ times or more as large as an electric resistance value between the second electrode and a first electrode, preferably $1*10^2$ times or more as large as the electric resistance value between the second electrode and the first electrode, and more preferably $1*10^3$ times or more as large as the electric resistance value between the second electrode and the first electrode. A pulse current or a pulse voltage coincided with the pulse current or the pulse voltage applied to the first section of the second electrode may be applied to the second section of the second electrode, or direct current bias may be applied to the second section of the second electrode. The voltage applied to the second section of the second electrode may be forward bias or reverse bias. The voltage applied to the first section of the second electrode is desirably higher than the voltage applied to the second section of the second electrode. Examples of arrangement state of the first section and the second section of the second electrode include the following:
1. Arrangement state in which N pieces of the first section of the second electrode and (N-1) pieces of the second section of the second electrode are provided, and the first sections of the second electrode sandwich the second section of the second electrode.
2. Arrangement state in which N pieces of the second section of the second electrode and (N-1) pieces of the first section of the second electrode are provided, and the second sections of the second electrode sandwich the first section of the second electrode.

The separation trench is able to be formed in the second electrode by etching the second electrode. In this case, where an etching rate of the second electrode is $ER_0$, and an etching rate of the laminated structure is $ER_1$, it is desirable to satisfy $ER_0/ER_1 \geq 1*10$, preferably $ER_0/ER_1 \geq 1*10^2$. In the case where $ER_0/ER_1$ satisfies such a relation, the second electrode is able to be surely etched without etching the laminated structure (or even if the laminated structure is etched, the etching amount is slight). In this case, it is preferable that the second electrode is composed of a palladium (Pd) single layer, a nickel (Ni) single layer, a platinum (Pt) single layer, or a laminated structure of a lower metal layer and an upper metal layer in which the lower metal layer is contacted with the second compound semiconductor layer (however, the lower metal layer is composed of one metal selected from the group consisting palladium, nickel, and platinum; and the upper metal layer is composed of a metal having the same etching rate of the second electrode as an etching rate of the lower metal layer, an etching rate similar to the etching rate of the lower metal layer, or an etching rate higher than the etching rate of the lower metal layer). In the case where the lower metal layer is composed of palladium and the upper metal layer is composed of nickel, the thickness of the upper metal layer is desirably 0.1 μm or more, and preferably 0.2 μm or more. Otherwise, the second electrode is preferably composed of the palladium (Pd) single layer. In this case, the thickness thereof is desirably 20 nm or more, and preferably 50 nm or more. Further, an etching liquid used for etching the second electrode is desirably nitro hydrochloric acid, nitric acid, sulfuric acid, hydrochloric acid, or a mixed liquid composed of at least two types out of these acids (specifically, a mixed liquid composed of nitric acid and sulfuric acid, or a mixed liquid composed of sulfuric acid and hydrochloric acid).

In a laser diode device or the like of the invention including the foregoing preferred form, the first structure laser diode device, the second structure laser diode device, and the third structure laser diode device, the laser diode device may have a ridge stripe type separate confinement heterostructure (SCH structure (Separate Confinement Heterostructure)). A distance (D) from a top face of a section of the second compound semiconductor layer positioned outside of both side faces of a ridge section to the active layer may be $1.0*10^{-7}$ m (0.1 μm) or more. Such a structure is referred to as "fourth structure laser diode device" for convenience. By determining the distance (D) as above, the saturable absorption region is able to be surely formed on both sides of the active layer (Y direction). The upper limit of the distance (D) is able to be determined based on threshold current increase, temperature characteristics, deterioration of current increase rate in driving for a long time and the like. The ridge section is able to be formed by removing part of the second compound semiconductor layer in the thickness direction by, for example, RIE method. As the width of the ridge section in the ridge stripe structure is able to be exemplified as 2 μm or less. Further, a laminated insulating film having $SiO_2$/Si laminated structure is formed on both side faces of the ridge section. A difference between an effective refractive index of the ridge section and an effective refractive index of the laminated insulating film may be from $5*10^{-3}$ to $1*10^{-2}$ both inclusive. By using such a laminated insulating film, even in the case of high output operation exceeding 70 watt, single fundamental transverse mode is able to be retained. Though the lower limit value of the width of the ridge section is not limited, examples thereof include 0.8 μm.

In the laser diode device or the like of the invention including the foregoing preferred form, the preferred composition, the first structure laser diode device, the second structure laser diode device, and the third structure laser diode device, the laminated structure may be composed of AlGaInN compound semiconductor. That is, the laser diode device may be a GaN laser diode device. More specifically, for example, the second compound semiconductor layer may have a laminated structure composed of at least the electron barrier layer and a cladding layer from the active layer side, the cladding layer may have a superlattice structure in which a p-type GaN layer and a p-type AlGaN layer are alternately layered, the electron barrier layer may be composed of a p-type AlGaN layer, and an Al composition ratio in the electron barrier layer may be higher than an Al average composition ratio in the cladding layer. Specifically, where a composition of the electron barrier layer is expressed as $Al_xGa_{1-x}N$, the Al composition ratio in the electron barrier layer is able to be exemplified as $0.05 \leq x \leq 0.5$, preferably $0.15 \leq x \leq 0.25$, and more preferably $0.18 \leq x \leq 0.20$.

Specific examples of AlGaInN compound semiconductor include GaN, AlGaN, GaInN, and AlGaInN. Further, such a compound semiconductor may include boron (B) atom, thallium (Tl) atom, arsenic (As) atom, phosphorus (P) atom, or antimony (Sb) atom according to needs. Further, the active layer having a quantum well structure has a structure in which at least one well layer and at least one barrier layer are layered. As a combination of compound semiconductor composing the well layer and compound semiconductor composing the barrier layer, $(In_yGa_{(1-y)}N, GaN)$, $(In_yGa_{(1-y)}N, In_zGa_{(1-z)}N)$ (y>z), and $(In_yGa_{(1-y)}N, AlGaN)$ are able to be exemplified. In some cases, AlGaInN compound semiconductor composing the laminated structure of the laser diode device is hereinafter referred to as "GaN compound semiconductor." In some cases, the AlGaInN compound semiconductor layer is hereinafter referred to as "GaN compound semiconductor layer."

A section of the second compound semiconductor layer positioned between the electron barrier layer and the second electrode may be the cladding layer having the superlattice structure in which the p-type GaN layer and the p-type AlGaN layer are alternately layered as described above. The thickness of the cladding layer is preferably 0.7 µm or less. By adopting the superlattice structure, while a high refractive index necessary as the cladding layer is maintained, a series resistance component of the laser diode device is able to be decreased, leading to realizing a low operation voltage of the laser diode device. The lower limit value of the thickness of the superlattice structure is not limited, but the lower limit value is, for example, 0.3 µm. As the thickness of the p-type GaN layer composing the superlattice structure, a thickness from 1 nm to 5 nm both inclusive is able to be exemplified. As the thickness of the p-type AlGaN layer composing the superlattice structure, a thickness from 1 nm to 5 nm both inclusive is able to be exemplified. As the total number of layers of the p-type GaN layer and the p-type AlGaN layer, the number from 60 to 300 both inclusive is able to be exemplified. Further, the second electrode may be provided on the second compound semiconductor layer. The distance from the active layer to the second electrode may be 1 µm or less, and preferably 0.6 µm or less. By defining the distance from the active layer to the second electrode, the thickness of the p-type second compound semiconductor layer having high resistance is able to be decreased, and the operation voltage of the laser diode device is able to be decreased. Though the lower limit value of the distance from the active layer to the second electrode is not limited, and for example, the lower limit value of the distance from the active layer to the second electrode is 0.3 µm. Further, the second compound semiconductor layer may be doped with Mg at the level of $1*10^{19}$ cm$^{-3}$ or more. An absorption coefficient of the second compound semiconductor layer to 405 nm wavelength light from the active layer may be at least 50 cm$^{-1}$. An atom concentration of Mg comes from material physicality that the maximum electron hole concentration is shown at the value of $2*10^{19}$ cm$^{-3}$, and a result of design that the maximum electron hole concentration, that is, specific resistance of the second compound semiconductor layer becomes the minimum. The absorption coefficient of the second compound semiconductor layer is defined in view of decreasing resistance of the laser diode device as much as possible. In result, in general, an absorption coefficient of light of the active layer becomes 50 cm$^{-1}$. However, it is possible that the Mg dope amount is intentionally set to the concentration of $2*10^{19}$ cm$^{-3}$ or more in order to increase the absorption coefficient. In this case, the upper limit Mg dope amount for obtaining a practical electron hole concentration is, for example, $8*10^{19}$ cm$^{-3}$.

In the second compound semiconductor layer, a non-doped compound semiconductor layer (for example, a non-doped GaInN layer or a non-doped AlGaN layer) may be formed as a lower cladding layer between the active layer and the electron barrier layer. Further, a non-doped GaInN layer as a light guide layer may be formed between the active layer and the lower cladding layer. The uppermost layer of the second compound semiconductor layer may have a structure occupied by an Mg doped GaN layer (p-side contact layer). Further, a beam radiation half-value angle $\theta^\perp$ in the vertical direction of laser light outputted from the end face of the laser diode device may be 25 deg or less, or preferably 21 deg or less. Though the lower limit value of the beam radiation half-value angle $\theta^\perp$ is not limited, for example, the lower limit value is 17 deg. Further, as the resonant length, from 0.3 mm to 2 mm both inclusive is able to be exemplified. Further, a bandgap of compound semiconductor composing the well layer in the active layer is desirably 2.4 eV or more. Further, a wavelength of laser light outputted from the active layer is desirably from 360 nm to 500 nm both inclusive, and preferably from 400 nm to 410 nm both inclusive. It is needless to say that the foregoing various structures are able to be combined as appropriate.

In a method of driving a laser diode device according to a first aspect of the invention using the laser diode device of the invention including the various preferred forms and the preferred compositions described above, laser may be oscillated after pulse current rising and before pulse current falling. Otherwise, laser may be oscillated concurrently with pulse current falling, or after pulse current falling. Thereby, so-called generation of jitter is able to be surely inhibited. The pulse width of the pulse current is preferably equal to or more than carrier life time (for example, from 1 nanosecond to 2 nanosecond both inclusive) as time necessary for recombination of natural emitted light.

In a method of driving a laser diode device according to a second aspect of the invention using the laser diode device of the invention including the various preferred forms and the preferred compositions described above, laser may be oscillated after pulse voltage rising and before pulse voltage falling. Otherwise, laser may be oscillated concurrently with pulse voltage falling, or after pulse voltage falling. Thereby, so-called generation of jitter is able to be surely inhibited. If the electric pulse width should be decreased, it is enough that an applied voltage is increased. The pulse width of the pulse voltage is preferably equal to or more than carrier life time (for example, from 1 nanosecond to 2 nanosecond both inclusive).

In a laser diode device including the various preferred forms and the various compositions described above or the method of driving the same according to the first aspect of the invention and a laser diode apparatus according to the first aspect of the invention (hereinafter generically referred to as "first aspect of the invention" in some cases), a value of the pulse current may be 0.4 ampere or more, and preferably 0.8 ampere or more. Otherwise, in the case where the value of the pulse current is converted to a value per 1 cm$^2$ of an active layer (per 1 cm$^2$ of a joint region area), that is, in the case where the value of the pulse current is converted to a current density (operation current density, unit: ampere/cm$^2$), the value may be $3.5*10^4$ ampere/cm$^2$ or more, and preferably $7*10^4$ ampere/cm$^2$ or more.

Further, in a laser diode device including the various preferred forms and the preferred compositions described above or the method of driving the same according to a second aspect of the invention and a laser diode apparatus according to the second aspect of the invention (hereinafter generically referred to as "second aspect of the invention" in some cases), a value of the pulse voltage may be 8 volt or more, and preferably 16 volt or more.

In the laser diode device or the method of driving the same according to the first aspect or the second aspect of the invention and the laser diode apparatus according to the first aspect or the second aspect of the invention including the various preferred forms and the preferred compositions described above (hereinafter generically referred to as "the invention" in some cases), various GaN compound semiconductor layers composing the laser diode device are sequentially formed over a substrate. Examples of the substrate include a GaN substrate, a sapphire substrate, a GaAs substrate, an SiC substrate, an alumina substrate, a ZnS substrate, a ZnO substrate, an MN substrate, an LiMgO substrate, an LiGaO$_2$ substrate, an MgAl$_2$O$_4$ substrate, an InP substrate, an Si substrate, and a laminated body in which a foundation layer and a buffer layer are formed on the surface (main face) of the foregoing substrate. Further, examples of methods of forming the various GaN compound semiconductor layers composing the laser diode device include metal organic chemical vapor deposition method (MOCVD method and MOVPE method), molecular beam epitaxy method (MBE method), and hydride vapor growth method in which halogen contributes to transfer or reaction.

Examples of organic gallium source gas in MOCVD method include trimethyl gallium (TMG) gas and triethyl gallium (TEG) gas. Examples of nitrogen source gas include ammonia gas and hydrazine gas. In forming the GaN compound semiconductor layer having n-type conductivity type, for example, silicon (Si) may be added as n-type impurity (n-type dopant). In forming the GaN compound semiconductor layer having p-type conductivity type, for example, magnesium (Mg) may be added as p-type impurity (p-type dopant). Further, in the case where aluminum (Al) or indium (In) is contained as a component atom of the GaN compound semiconductor layer, trimethyl aluminum (TMA) gas may be used as an Al source, and trimethyl indium (TMI) gas may be used as an In source. Further, monosilane gas (SiH$_4$ gas) may be used as an Si source, and ciclopentadienyl magnesium gas, methylciclopentadienyl magnesium, or bisciclopnetadienyl magnesium (Cp$_2$Mg) may be used as an Mg source. Examples of n-type impurity (n-type dopant) include Ge, Se, Sn, C, Te, S, O, Pd, and Po in addition to Si. Examples of p-type impurity (p-type dopant) include Zn, Cd, Be, Ca, Ba, C, Hg, and Sr in addition to Mg.

In general, the second electrode electrically connected to the second compound semiconductor layer having p-type conductivity type (or the second electrode formed on the contact layer) preferably has a single layer structure or a multilayer structure containing at least one metal selected from the group consisting of palladium (Pd), platinum (Pt), nickel (Ni), Al (aluminum), Ti (titanium), gold (Au), and silver (Ag), or a transparent conducive material such as ITO (Indium Tin Oxide) may be used therefor. Meanwhile, the first electrode electrically connected to the first compound semiconductor layer having n-type conductivity type desirably has a single layer structure or a multilayer structure containing at least one metal selected from the group consisting of gold (Au), silver (Ag), palladium (Pd), Al (aluminum), Ti (titanium), tungsten (W), Cu (copper), Zn (zinc), tin (Sn) and indium (In), and for example, Ti/Au, Ti/Al, and Ti/Pt/Au are able to be exemplified. The first electrode and the second electrode are able to be formed by PVD method such as vacuum evaporation method and sputtering method. The first electrode is electrically connected to the first compound semiconductor layer. The first electrode may be formed on the first compound semiconductor layer, and the first electrode may be connected to the first compound semiconductor layer with a conductive material layer or a conducive substrate in between. The second electrode is formed on the second compound semiconductor layer, and the second electrode may be connected to the second compound semiconductor layer with a conductive material layer in between in some cases.

A pad electrode may be provided on the first electrode and the second electrode in order to obtain electrical connection to an external electrode or a circuit. The pad electrode desirably has a single layer structure or a multilayer structure containing at least one metal selected from the group consisting of Ti (titanium), Al (aluminum), Pt (platinum), Au (gold), and Ni (nickel). Otherwise, the pad electrode may have a multilayer structure exemplified as a Ti/Pt/Au multilayer structure and a Ti/Au multilayer structure.

The invention is able to be applied to various fields such as the optical disc system, the communication field, the optical information field, the photoelectronic integration circuit, the field applying nonlinear optical phenomenon, the optical switch, the laser measurement field and various analysis fields, the ultrafast spectroscopy field, the multiphoton excitation spectroscopy field, the mass analysis field, the microspectroscopic field using multiphoton absorption, quantum control of chemical reaction, the nano three-dimensional processing field, various processing fields applying multiphoton absorption, the medical field, and the bio imaging field.

First Embodiment

Figure 1B:
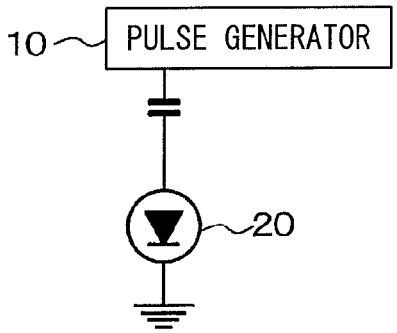
Figure 1C:
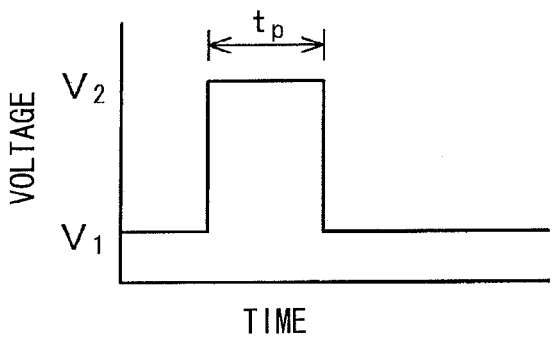
FIG. 1C and FIG. 1D are schematic views of a rectangular pulse voltage applied to a laser diode device.
Figure 1D:
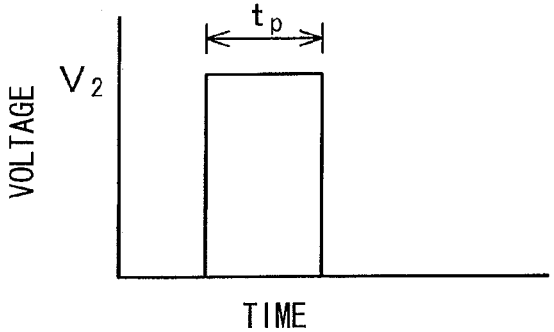
Figure 2:
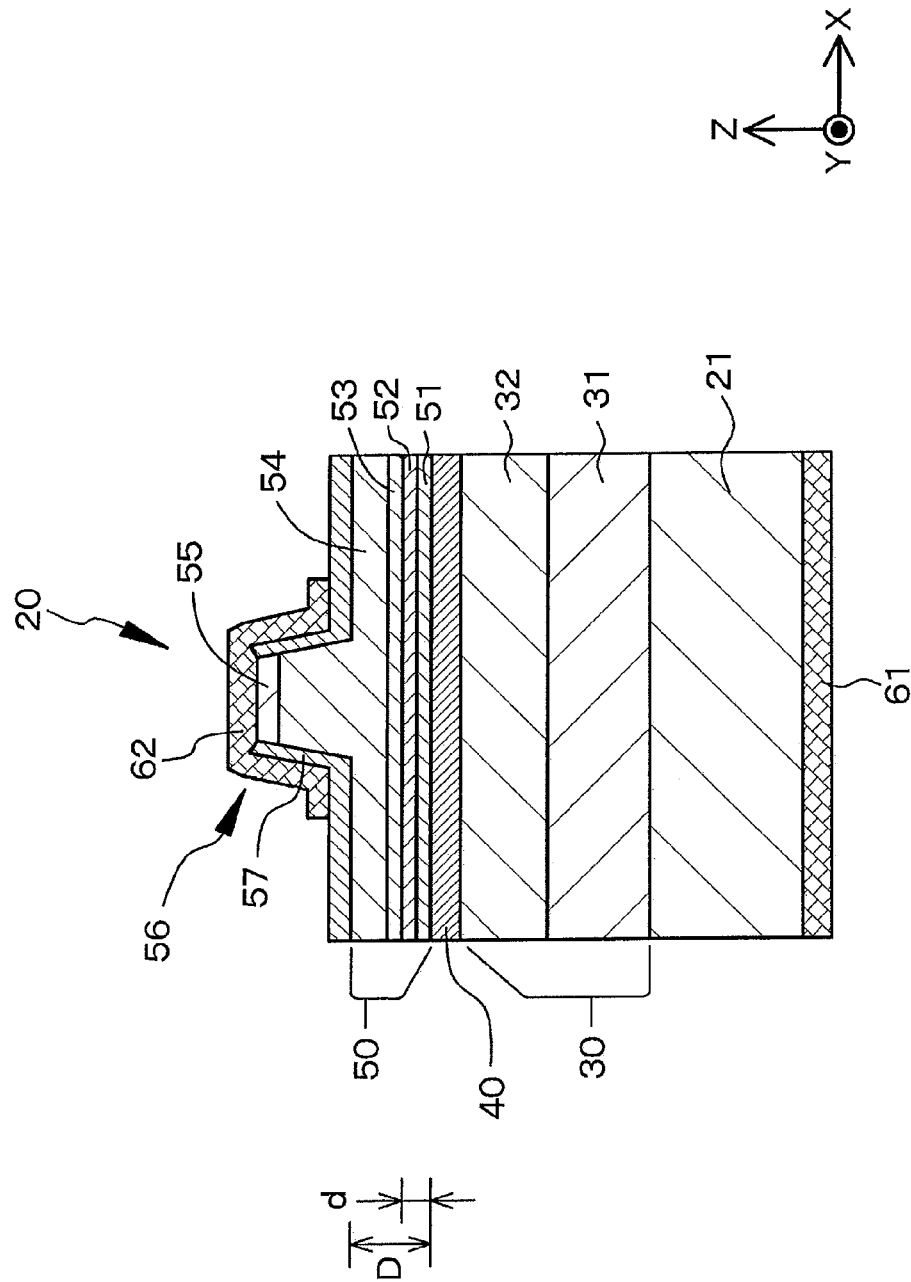
FIG. 2 is a schematic cross sectional view of the laser diode device of the first embodiment where the laser diode device is cut along a virtual plane perpendicular to a direction in which a resonator is extended.
Figure 3:
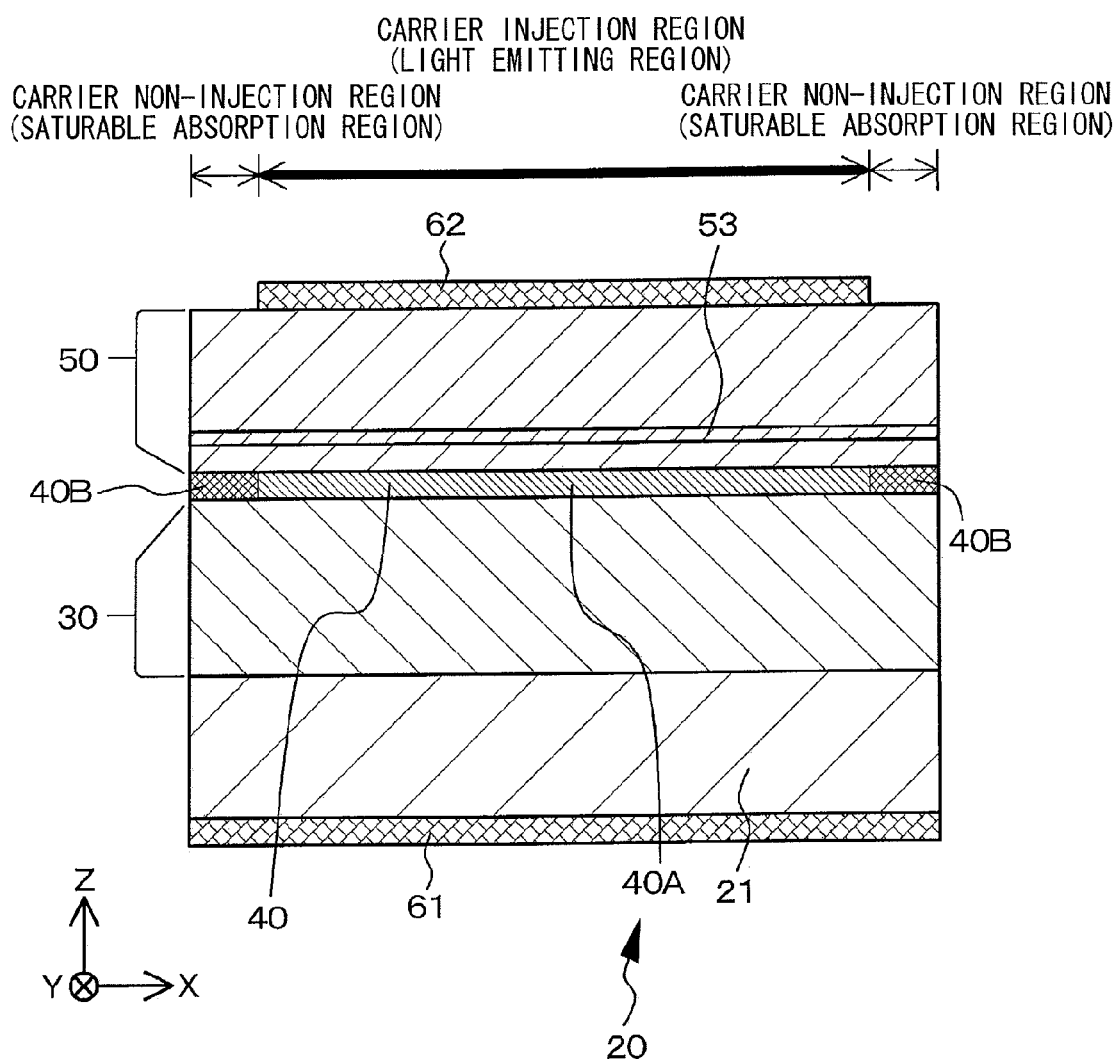
FIG. 3 is a schematic cross sectional view of the laser diode device of the first embodiment where the laser diode device is cut along a virtual plane including the direction in which the resonator is extended.

The first embodiment relates to the laser diode device, the method of driving the same, and the laser diode apparatus according to the first aspect of the invention and the second aspect of the invention, and further relates to the first structure laser diode device, the second structure laser diode device, and the fourth structure laser diode device. A conceptual diagram of the laser diode apparatus of the first embodiment is illustrated in FIG. 1A or FIG. 1B. A rectangular pulse voltage applied to the laser diode device is schematically illustrated in FIG. 1C or FIG. 1D. A schematic cross sectional view of the laser diode device where the laser diode device is cut along a virtual perpendicular plane (YZ plane) perpendicular to the resonator direction (X direction) of the laser diode device of the first embodiment is illustrated in FIG. 2. A schematic cross sectional view of the laser diode device where the laser diode device is cut along a virtual perpendicular plane (XZ plane) including the resonator direction of the laser diode device is illustrated in FIG. 3.

The laser diode apparatus including an ultrashort pulse and ultrahigh power laser diode device of the first embodiment is composed of, as illustrated in FIG. 1A, a pulse generator 10 and a laser diode device 20 driven by a drive pulse from the pulse generator 10. Specifically, the laser diode apparatus is composed of the GaN laser diode device 20 in light emitting wavelength band of 405 nm and the high output pulse generator 10 for making the GaN laser diode device 20 gain-switching operate. The laser diode apparatus includes a direct current constant current power source 11. However, as illustrated in FIG. 1B, the laser diode apparatus does not necessarily include the direct current constant current power source 11. The direct current constant current power source 11 is a known circuit component. As the pulse generator 10, a combination structure of a low voltage pulse generator and a high output voltage amplifier is able to be used.

A voltage (drive pulse) applied to the laser diode device 20 is, as illustrated in FIG. 1C, a rectangular pulse voltage V$_2$ of a time width (pulse width) t$_p$. Since the direct current constant current power source 11 is included, the resultant value is obtained by adding the rectangular pulse voltage V$_2$ of the time width t$_p$ to a direct current voltage V$_1$. The direct current voltage V$_1$ is expressed by the following formula, where a current value supplied from the direct current constant current power source 11 is $I_1$, an internal resistance of the laser diode device 20 is R, and a built-in potential of p-n junction is $V_0$:

$V_1 = R*I_1 + V_0 \sim V_0 = 3$ Volt

In this case, wiring resistance, contact resistance between a wiring and the laser diode device 20 and the like are ignored. In the circuit structure illustrated in FIG. 1B, as illustrated in FIG. 1D, a voltage applied to the laser diode device 20 is the rectangular pulse $V_2$ of the time width $t_p$.

The laser diode device 20 of the first embodiment is a laser diode device having a ridge stripe type separate confinement heterostructure (SCH structure). Specifically, the laser diode device 20 is a GaN laser diode device composed of index guide type AlGaInN that has been developed for the Blu-ray optical disc system, and has a ridge stripe structure. The specifications thereof are as follows: optical output of the absolute maximum rating is 120 milliwatt at the time of continuous drive, and 250 milliwatt at the time of pulse drive (pulse width: 7.5 nanosecond, duty ratio: 50%); a standard value of light emitting wavelength is 405 nm; a threshold current value $I_{th}$ (standard value of an oscillation start current) is 40 milliampere; and standard values of a radiation angle in parallel with the active layer of laser light outputted from the end face of the laser diode device 20 (beam radiation half-value angle in the horizontal direction θ//) and a radiation angle perpendicular to the active layer of laser light outputted from the end face of the laser diode device 20 (beam radiation half-value angle in the vertical direction θ⊥) are respectively 8 degree and 21 degree. The laser diode device 20 is a laser diode device having high output specification with lowered light confinement in the lamination direction (vertical direction) of the after-mentioned compound semiconductor layer. Further, the resonant length is 0.8 mm.

As the schematic cross sectional view illustrated in FIG. 2, the laser diode device 20 of the first embodiment is provided on (0001) plane of an n-type GaN substrate 21 and includes:
A. a laminated structure composed of a first compound semiconductor layer 30 containing n-type impurity, an active layer 40 having a quantum well structure, and a second compound semiconductor layer 50 containing p-type impurity,
B. a first electrode 61 electrically connected to the first compound semiconductor layer 30, and
C. a second electrode 62 electrically connected to the second compound semiconductor layer 50.

The first compound semiconductor layer 30, the active layer 40, and the second compound semiconductor layer 50 are composed of GaN compound semiconductor, specifically AlGaInN compound semiconductor.

Further, in the second compound semiconductor layer 50, an electron barrier layer 53 having a thickness of $1.5*10^{-8}$ m (15 nm) or more, specifically, the p-type AlGaN electron barrier layer 53 having a thickness of 15 nm or 30 nm is provided. The distance (d) from the electron barrier layer 53 to the active layer 40 is $8*10^{-8}$ m (80 nm) or less, and specifically 40 nm.

More specifically, the laser diode device 20 has a layer structure illustrated in the following Table 1. In Table 1, the listed items are shown in the order from the layer farthest from the n-type GaN substrate 21 to the layer closest to the n-type GaN substrate 21. The bandgap of compound semiconductor composing the well layer in the active layer 40 is 3.06 eV. The Al composition ratio in the electron barrier layer 53 is higher than an Al average composition ratio in a cladding layer 54. Specifically, the Al composition ratio in the electron barrier layer 53 is 0.18 ($Al_{0.18}Ga_{0.82}N$), and the Al average composition ratio in the cladding layer 54 is 0.03.

TABLE 1

| Second compound semiconductor layer 50 |
| --- |
| p-type GaN contact layer (Mg doped) 55 |
| p-type GaN (Mg doped)/AlGaN superlattice cladding layer 54 |
| p-type $Al_{0.18}Ga_{0.82}N$ electron barrier layer (Mg doped) 53 |
| non-doped AlGaN lower cladding layer 52 |
| non-doped GaInN light guide layer 51 |
| Active layer 40 |
| GaInN quantum well active layer (well layer: $Ga_{0.92}In_{0.08}N$/barrier layer: $Ga_{0.98}In_{0.02}N$) |
| First compound semiconductor layer 30 |
| n-type GaN cladding layer 32 |
| n-type AlGaN cladding layer 31 |

Further, part of the p-type GaN contact layer 55 and part of the p-type GaN/AlGaN superlattice cladding layer 54 are removed by RIE method, and a ridge section 56 having a width of 1.4 μm is formed. On both sides of the ridge section 56, a laminated insulating film 57 composed of $SiO_2$/Si is formed. The $SiO_2$ layer is the lower layer and the Si layer is the upper layer. The distance (D) from a top face of a section of the second compound semiconductor layer 50 positioned outside of both side faces of the ridge section 56 to the active layer 40 is $1.0*10^{-7}$ m or more, and specifically 120 nm. Further, the difference between the effective refractive index of the ridge section 56 and the effective refractive index of the laminated insulating film 57 is from $5*10^{-3}$ to $1*10^{-2}$ both inclusive, and specifically $7*10^{-3}$. On the p-type GaN contact layer 55 corresponding to the top face of the ridge section 56, the second electrode (p-type ohmic electrode or p-side electrode) 62 composed of Pd/Pt/Au is formed. Meanwhile, on the rear face of the n-type GaN substrate 21, the first electrode (n-type ohmic electrode or n-side electrode) 61 composed of Ti/Pt/Au is formed.

The thickness of the p-type GaN/AlGaN superlattice cladding layer 54 having a superlattice structure in which a p-type GaN layer and a p-type AlGaN layer are alternately layered is 0.7 μm or less, and specifically 0.4 μm. The thickness of the p-type GaN layer composing the superlattice structure is 2.5 nm. The thickness of the p-type AlGaN layer composing the superlattice structure is 2.5 nm. The total number of layers of the p-type GaN layer and the p-type AlGaN layer is 160. Further, the distance from the active layer 40 to the second electrode 62 is 1 μm or less, and specifically 0.6 μm. Further, the p-type AlGaN electron barrier layer 53, the p-type GaN/AlGaN superlattice cladding layer 54, and the p-type GaN contact layer 55 composing the second compound semiconductor layer 50 is doped with Mg at the level of $1*10^{19}$ cm$^{-3}$ or more (specifically at the level of $2*10^{19}$ cm$^{-3}$). The second compound semiconductor layer 50 is provided with the non-doped compound semiconductor layer (the non-doped GaInN light guide layer 51 and the non-doped AlGaN lower cladding layer 52) from the active layer side between the active layer 40 and the electron barrier layer 53.

The laser diode device of the first embodiment is the first structure laser diode device. The active layer 40 is composed of the carrier injection region and the carrier non-injection region. That is, the laser diode device of the first embodiment is categorized as a kind of multi-section laser diode device in which the carrier injection region (light emitting region, gain region 40A) and the carrier non-injection region (saturable absorption region 40B) are apposed in the resonator direction.

As arrangement state of the carrier injection region and the carrier non-injection region, specifically, as illustrated in FIG. 3, N pieces (in the first embodiment, N=2) of the carrier non-injection region and (N-1) pieces of the carrier injection region are provided, and the carrier non-injection regions sandwich the carrier injection region. The carrier non-injection regions are positioned at the end section of the resonator, and is 5 μm long.

Otherwise, the laser diode device of the first embodiment is the second structure laser diode device. The length of the second electrode 62 is smaller than the length of the active layer 40. That is, the laser diode device of the first embodiment is categorized as a kind of multi-section laser diode device in which the light emitting region 40A (a section of the active layer 40 positioned directly below the second electrode 62) and the saturable absorption region 40B (a section of the active layer 40 other than the section of the active layer 40 positioned directly below the second electrode 62) are apposed in the resonator direction. N pieces (in the first embodiment, N=2) of the saturable absorption region 40B and (N-1) pieces of the light emitting region 40A are provided, and the saturable absorption regions 40B sandwich the light emitting region 40A. By adopting such a structure, damage on a light outputting end face of the laser diode device is hardly generated.

In the laser diode device and the method of driving the same of the first embodiment, the laser diode device is driven by a pulse current having a value 10 or more times as large as the threshold current value $I_{th}$, preferably 20 or more times as large as the threshold current value $I_{th}$, and more preferably 50 or more times as large as the threshold current value $I_{th}$. The current value is a value significantly exceeding a current value (rated current) necessary for obtaining a rated light output. Otherwise, in the method of driving a laser diode device of the first embodiment, the laser diode device is driven by a pulse voltage having a value twice or more as large as a threshold voltage value $V_{th}$, preferably 4 or more times as large as the threshold voltage value $V_{th}$, and more preferably 10 or more times as large as the threshold voltage value $V_{th}$. Further, the laser diode device 20 of the first embodiment or the laser diode device 20 composing the laser diode apparatus of the first embodiment is driven by a pulse current having a value 10 or more times as large as the threshold current value $I_{th}$, preferably 20 or more times as large as the threshold current value $I_{th}$, and more preferably 50 or more times as large as the threshold current value $I_{th}$, and is driven by a pulse current significantly exceeding the rated current. Otherwise, the laser diode device 20 of the first embodiment or the laser diode device 20 composing the laser diode apparatus of the first embodiment is driven by a pulse voltage having a value twice or more as large as the threshold voltage value $V_{th}$, preferably 4 or more times as large as the threshold voltage value $V_{th}$, and more preferably 10 or more times as large as the threshold voltage value $V_{th}$.

In the laser diode device of the first embodiment, the thickness of the electron barrier layer 53 is defined. Further, the distance (d) between the electron barrier layer 53 and the active layer 40 is defined, and further, the distance (D) from the top face of the section of the second compound semiconductor layer 50 positioned outside of both side faces of the ridge section 56 to the active layer 40 is defined. That is, the light emitting region 40A is surrounded by the saturable absorption region 40B. More specifically, the light emitting region 40A (corresponding to the carrier injection region) is surrounded by the saturable absorption region 40B (corresponding to the carrier non-injection region) both in X direction and Y direction. Since the light emitting region 40A is surrounded by the saturable absorption region 40B as above, carrier of the saturable absorption region 40B is able to be flown into the light emitting region 40A at the time of high current injection, Q switch effect is largely increased, and the peak power is further increased.

Figure 14:
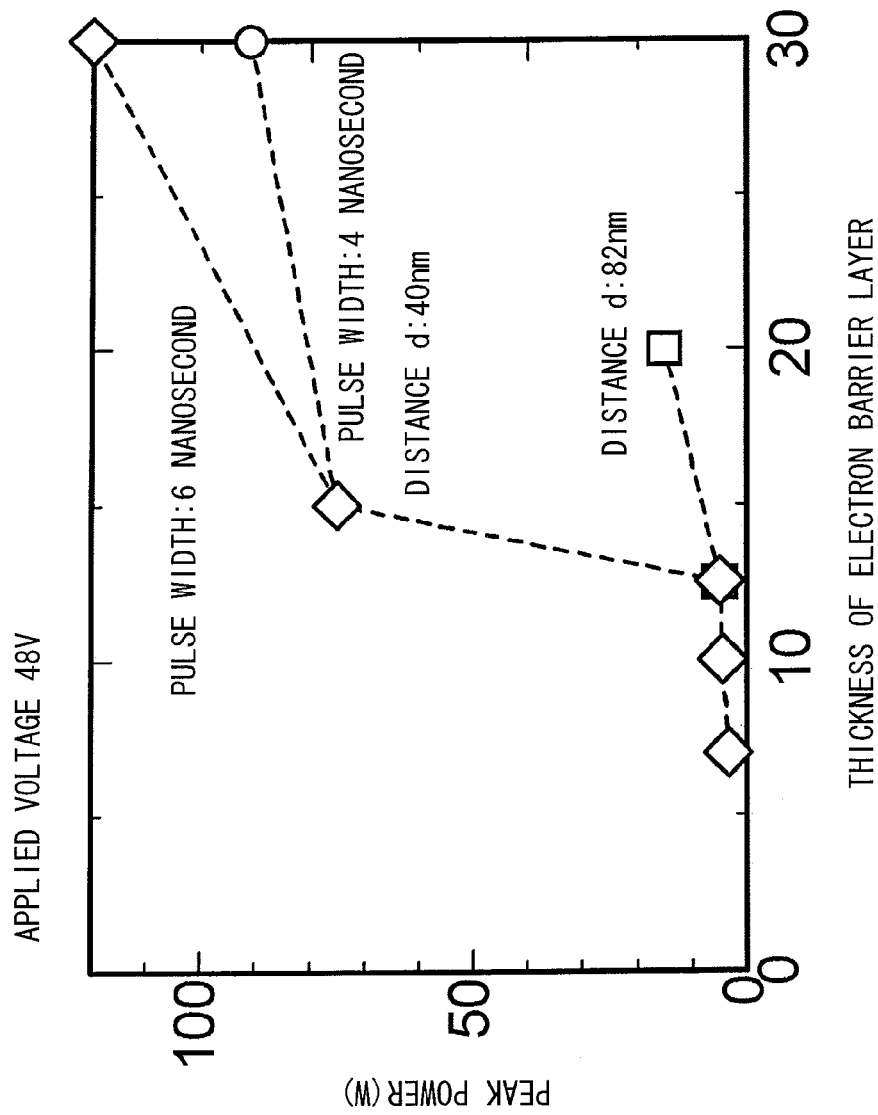
FIG. 14 is a graph illustrating a measurement result of peak power of the laser diode device of the first embodiment.

In the first embodiment, laser diode devices including the electron barrier layer 53 having a thickness of 7.5 nm, 10 nm, 12.5 nm, 15 nm, and 30 nm in which the distance (d) between the electron barrier layer 53 and the active layer 40 was 40 nm were fabricated. The voltage applied to the second electrode 62 was 48 volt, the first electrode 61 was grounded, the pulse width of the pulse current and the pulse voltage was 6 nanosecond, and the peak power of the laser diode device was measured at room temperature. In the case where the value of the pulse current is converted to a value per 1 cm² of the active layer (per 1 cm² of a joint region area), that is, in the case where the value of the pulse current is converted to a current density (operation current density, unit: ampere/cm²), the value was about 2.2*10⁵ ampere/cm². The result thereof is illustrated with the use of an outline lozenge in FIG. 14. In the case where the thickness of the electron barrier layer 53 was 30 nm, peak power 120 watt was able to be attained. The wavelength of pulse laser light was 405+/-5 nm. Even if the pulse width of the pulse current and the pulse voltage was 4 nanosecond, in the case where the thickness of the electron barrier layer 53 was 30 nm, peak power 90 watt was able to be attained (refer to the outline circle in the figure). Until the thickness of the electron barrier layer 53 reached 12.5 nm, the peak power value was low about 4 watt. When the thickness of the electron barrier layer 53 reached 15 nm, the peak power was drastically increased up to 70 watt. In the case where the distance (d) between the electron barrier layer 53 and the active layer 40 was 82 nm, even if the thickness of the electron barrier layer 53 was 20 nm, high peak power was not able to be obtained.

In the laser diode device of the first embodiment having such a structure, in the case where the electron barrier layer 53 having a thickness of $1.5*10^{-8}$ m (15 nm) or more was provided for the second compound semiconductor layer 50, the laser diode device was driven by a pulse current having a value 10 or more times as large as the threshold current value $I_{th}$, or the laser diode device was driven by a pulse voltage having a value twice or more as large as the threshold voltage value $V_{th}$, an ultrashort pulse and ultrahigh power laser diode device that outputs laser light having 70 watt or more peak power was able to be obtained.

Figure 15:
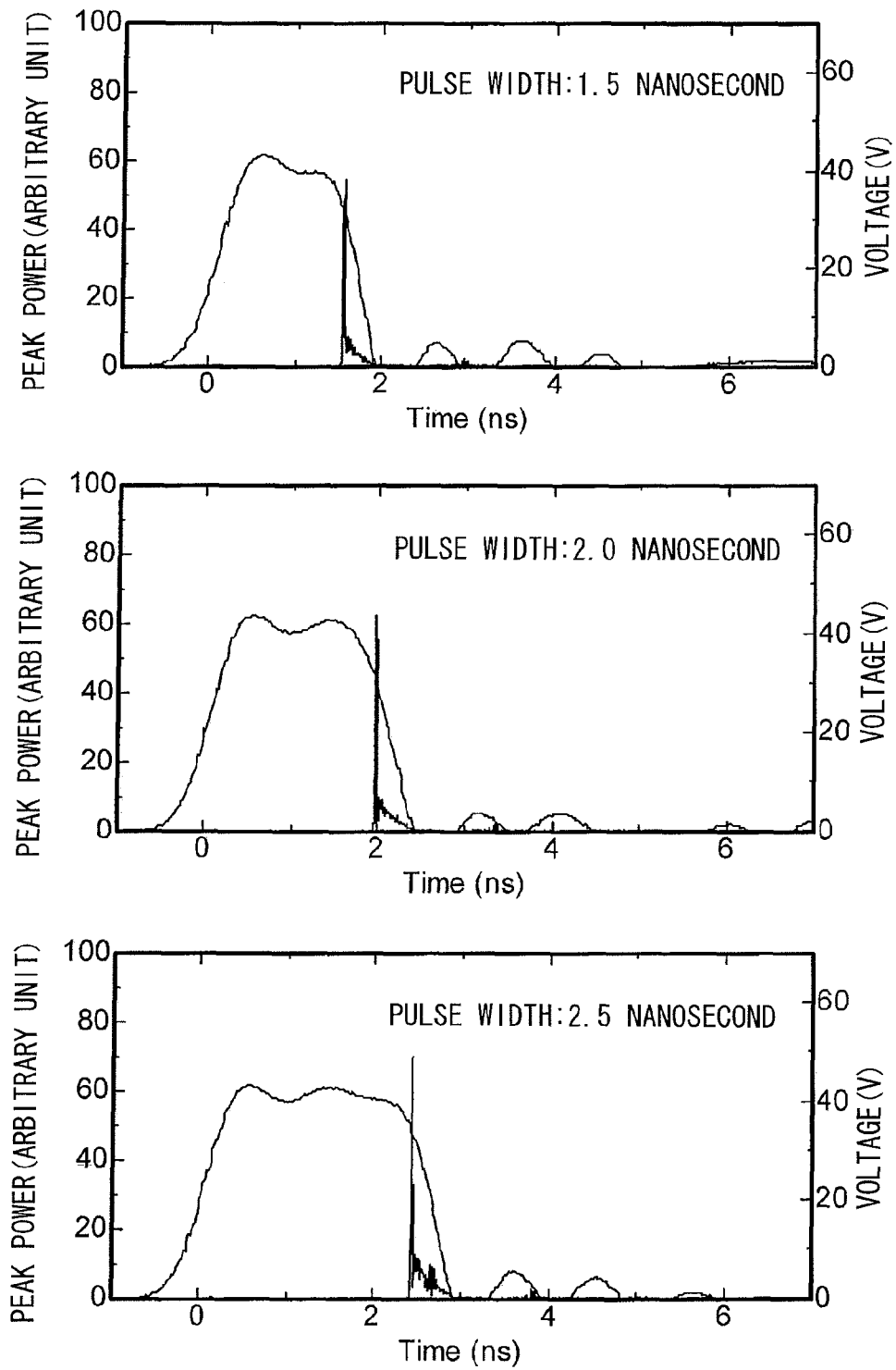
FIG. 15 is a graph illustrating a result of examining a relation between a pulse width of a pulse current/pulse voltage (1.5 nanosecond, 2.0 nanosecond, and 2.5 nanosecond) and laser oscillation state in the laser diode device of the first embodiment.
Figure 16:
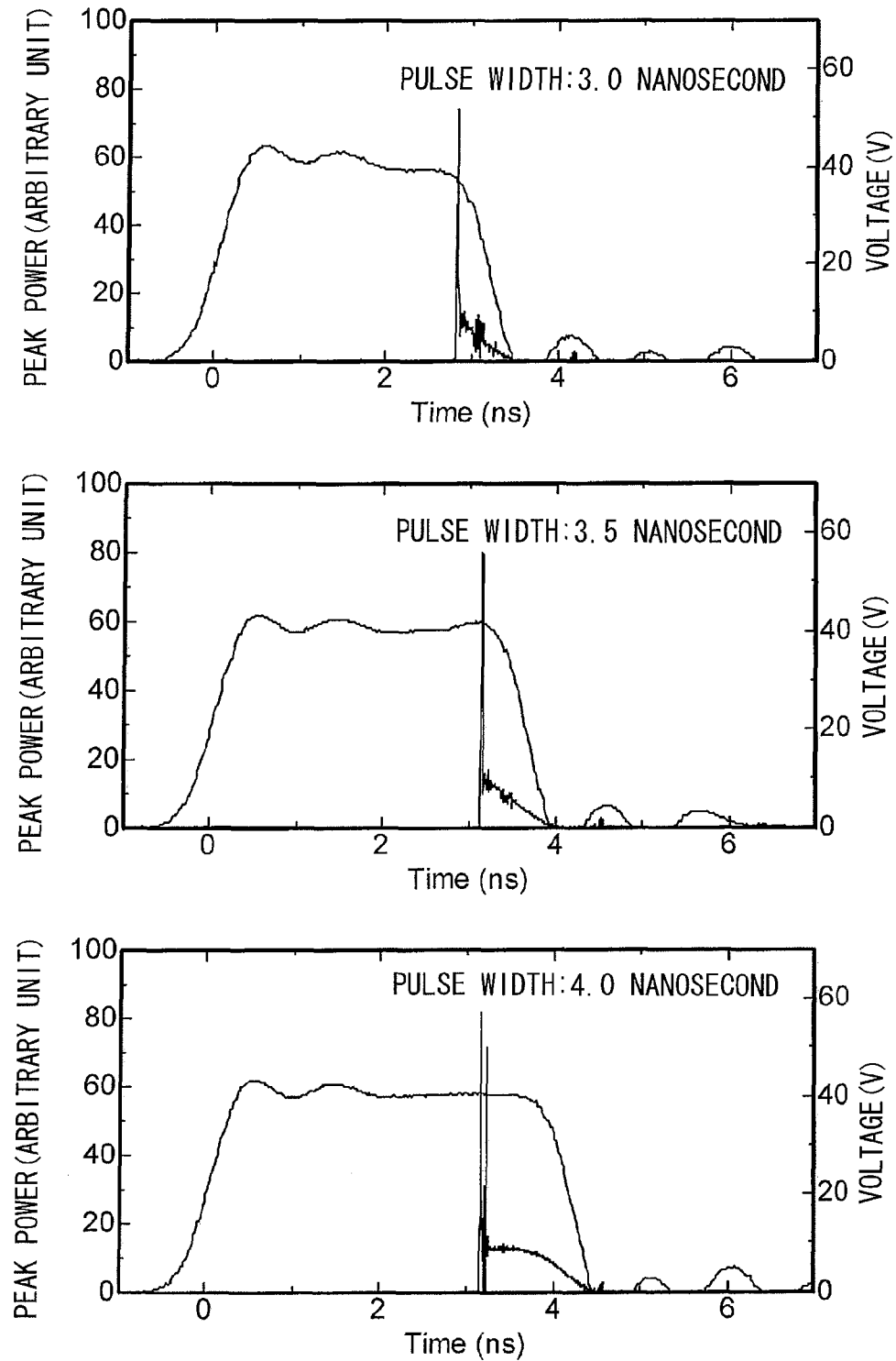
FIG. 16 is a graph illustrating a result of examining a relation between a pulse width of a pulse current/pulse voltage (3.0 nanosecond, 3.5 nanosecond, and 4.0 nanosecond) and laser oscillation state in the laser diode device of the first embodiment.
Figure 17:
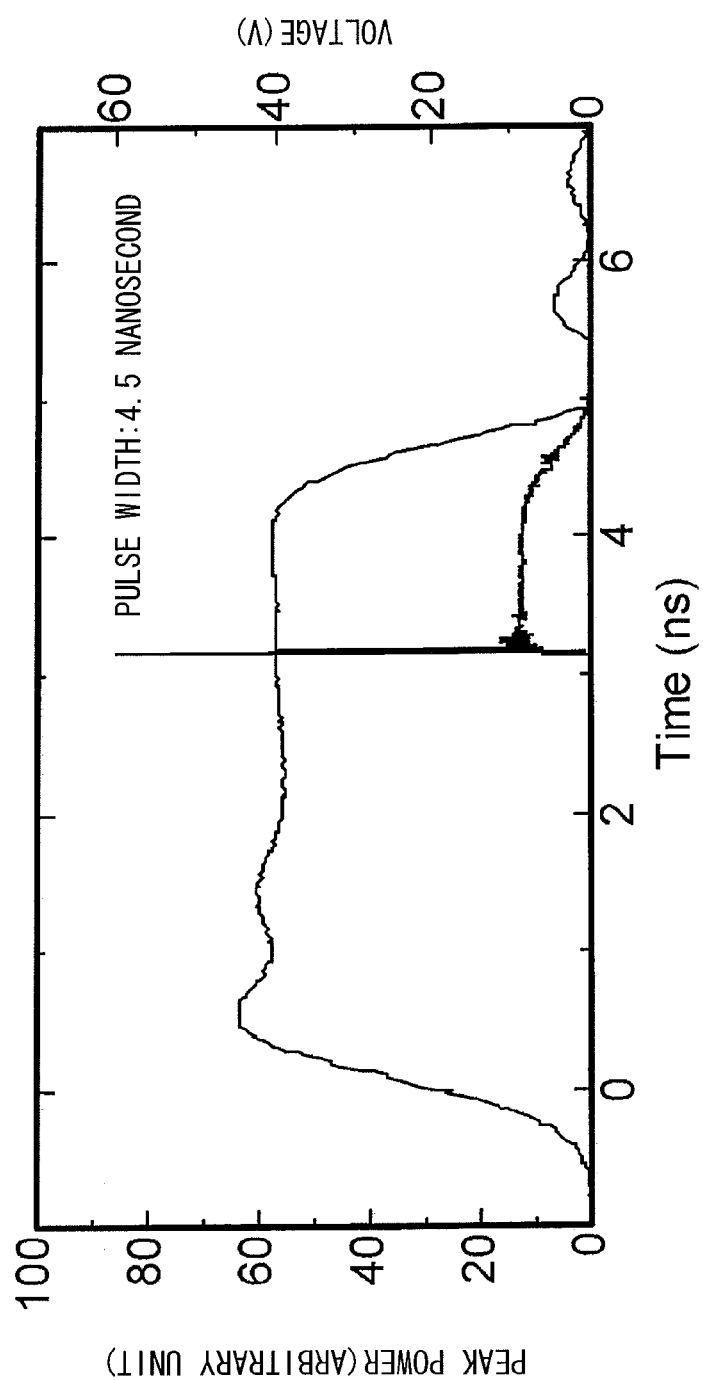
FIG. 17 is a graph illustrating a result of examining a relation between a pulse width of a pulse current/pulse voltage (4.5 nanosecond) and laser oscillation state in the laser diode device of the first embodiment.

FIGS. 15, 16, and 17 illustrate results of examining a relation between a pulse width of a pulse current or a pulse voltage and laser oscillation state. As evidenced by these figures, in the case where the pulse width is from 1.5 nanosecond to 3.5 nanosecond both inclusive, laser is oscillated concurrently with pulse current/pulse voltage falling, or after pulse current/pulse voltage falling. Further, as the pulse width of the pulse current or the pulse voltage is longer, peak power of laser light is increased. Further, the light pulse width is from 1 picosecond to 30 picosecond. Meanwhile, in the case where the pulse width is 4.0 nanosecond or 4.5 nanosecond, laser is oscillated after pulse current/pulse voltage rising, and before pulse current/pulse voltage falling. Peak power of laser light is not significantly increased. Further, a plurality of peaks are generated. From the foregoing results, in the laser diode device, by performing the foregoing test, a pulse width of a pulse current or a pulse voltage optimal for obtaining desired peak power is able to be obtained.

Figure 4:
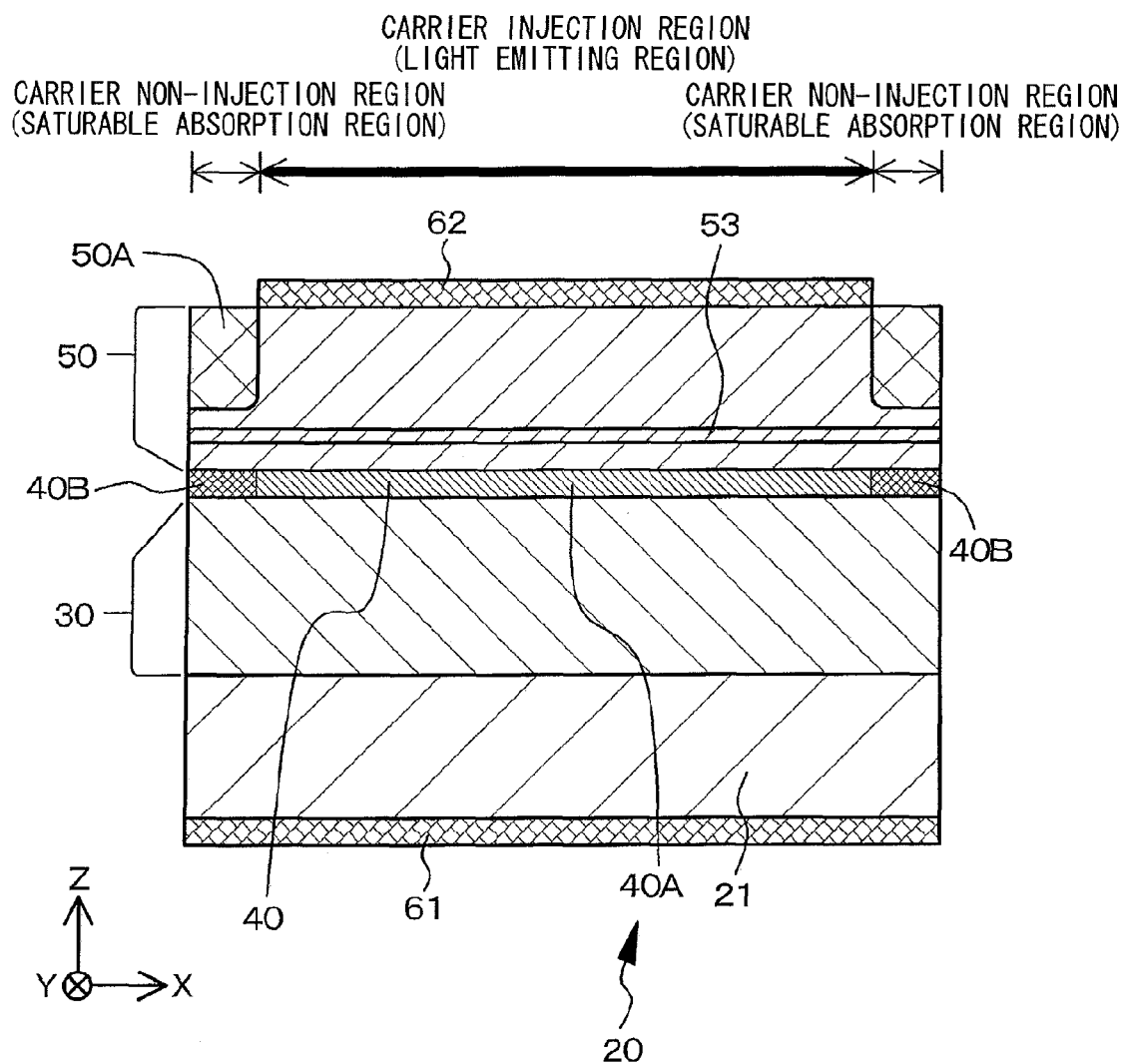
FIG. 4 is a schematic cross sectional view of a modified example of the laser diode device of the first embodiment where the laser diode device is cut along a virtual plane including the direction in which the resonator is extended.

As a modified example of the laser diode device of the first embodiment, as a schematic cross sectional view of a laser diode device cut along a virtual perpendicular plane (XZ plane) including the resonator direction in FIG. 4, the following structure may be adopted. In the structure, ion such as boron (B), aluminum (Al), and silicon (Si) is injected into a section of the second compound semiconductor layer 50 positioned above the carrier non-injection region or into a section of the second compound semiconductor layer 50 positioned above the saturable absorption region 40B to form a high resistance region 50A, and thereby a current flown into the saturable absorption region 40B is more surely limited (inhibited).

Second Embodiment

The second embodiment is a modified embodiment of the first embodiment. In the second embodiment, N pieces (in the second embodiment, N=2) of the carrier injection region and (N−1) pieces of the carrier non-injection region are provided, and the carrier injection regions sandwich the carrier non-injection region as a schematic cross sectional view of a laser diode device cut along a virtual perpendicular plane (XZ plane) including the resonator direction in FIG. 5. Otherwise, N pieces of the light emitting region (gain region) 40A and (N−1) piece of the saturable absorption region 40B are provided, and the light emitting regions 40A sandwich the saturable absorption region 40B.

Otherwise, in the laser diode device of the second embodiment, the second electrode 62 is separated into two sections by a separation trench 63. The width of the separation trench 63 is specifically 20 µm.

A composition and a structure of the laser diode device of the second embodiment are able to be similar to the composition and the structure of the laser diode device of the first embodiment except that the structure of the second electrode 62 is different, and thus detailed description will be omitted. Further, a method of driving a laser diode device and a laser diode apparatus of the second embodiment are able to be similar to the method of driving a laser diode device and the laser diode apparatus of the first embodiment, and thus detailed description will be omitted.

A description will be hereinafter given of a modified example of the laser diode device of the second embodiment with reference to FIG. 6 to FIG. 10 as a schematic cross sectional view of the laser diode device cut along a virtual perpendicular plane (XZ plane) including the resonator direction.

Figure 5:
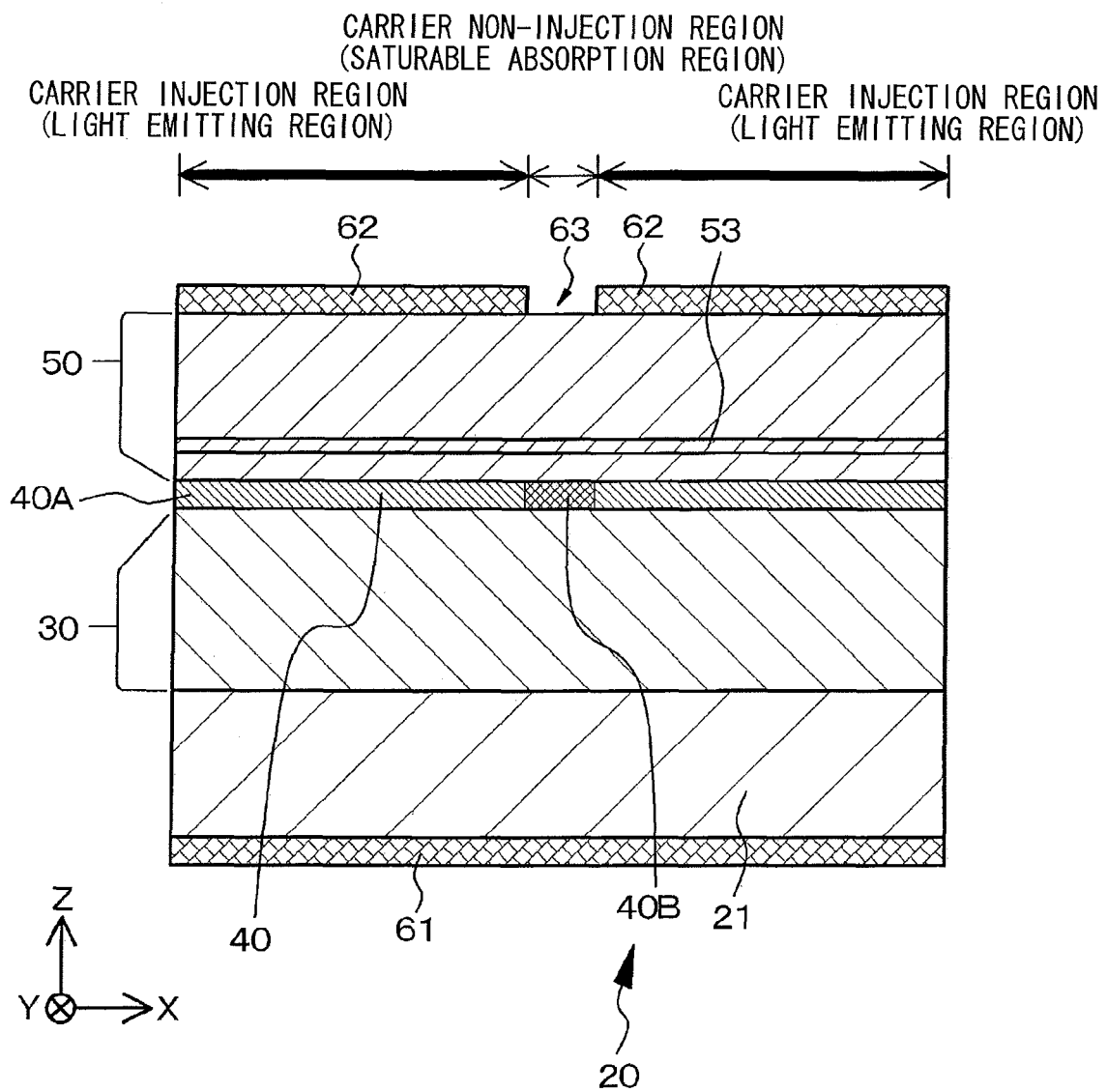
FIG. 5 is a schematic cross sectional view of a laser diode device of a second embodiment where the laser diode device is cut along a virtual plane including the direction in which the resonator is extended.
Figure 6:
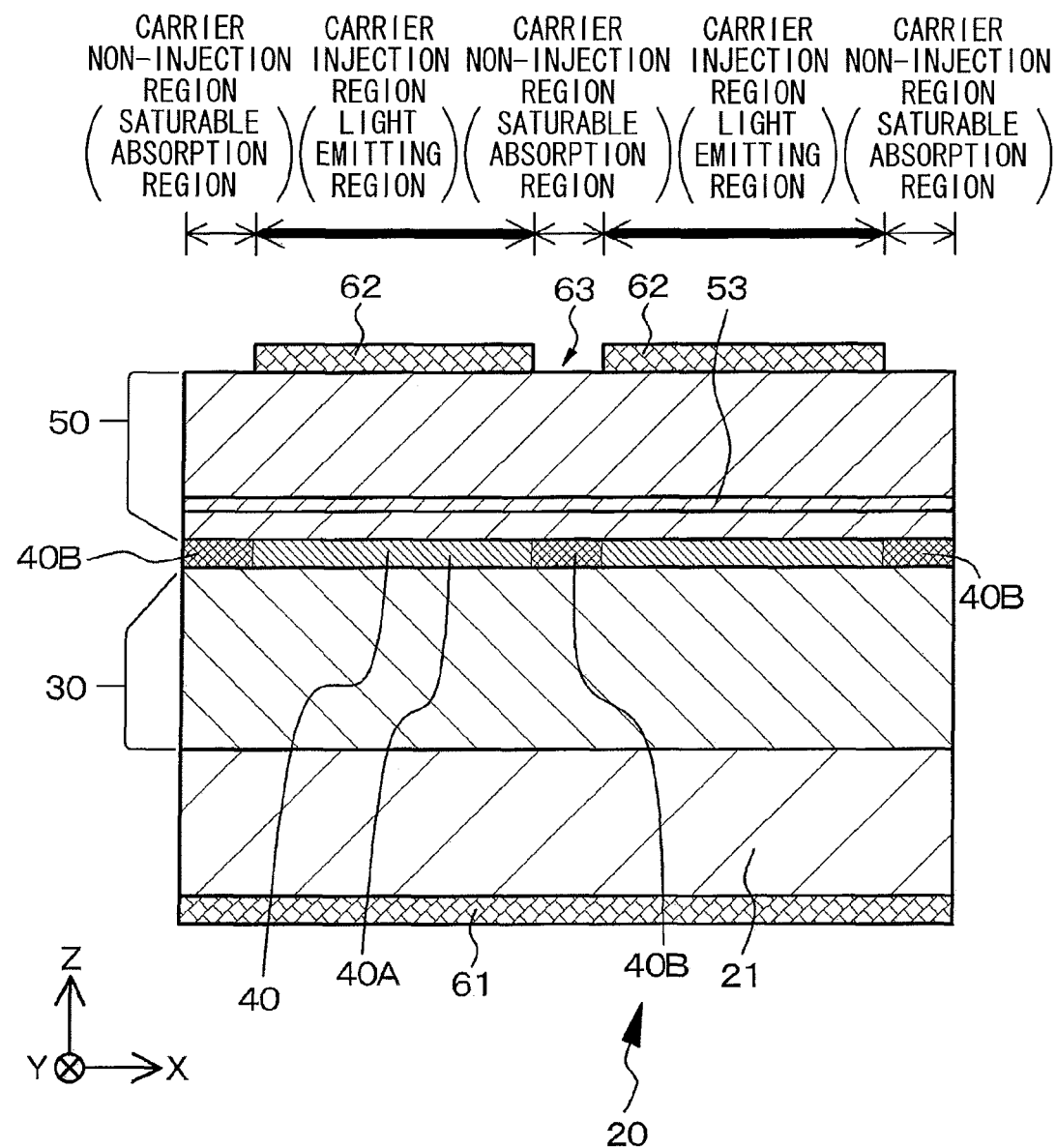
FIG. 6 is a schematic cross sectional view of a modified example of the laser diode device of the second embodiment where the laser diode device is cut along a virtual plane including the direction in which the resonator is extended.

The laser diode device illustrated in FIG. 6 is a modification of the laser diode device illustrated in FIG. 5. In the laser diode device, N pieces (in this case, N=3) of the carrier non-injection region and (N−1) pieces of the carrier injection region are provided, and the carrier non-injection regions sandwich the carrier injection region. Otherwise, N pieces (=3) of the saturable absorption region and (N−1) piece of the light emitting region are provided, and the saturable absorption regions sandwich the light emitting region.

Figure 7:
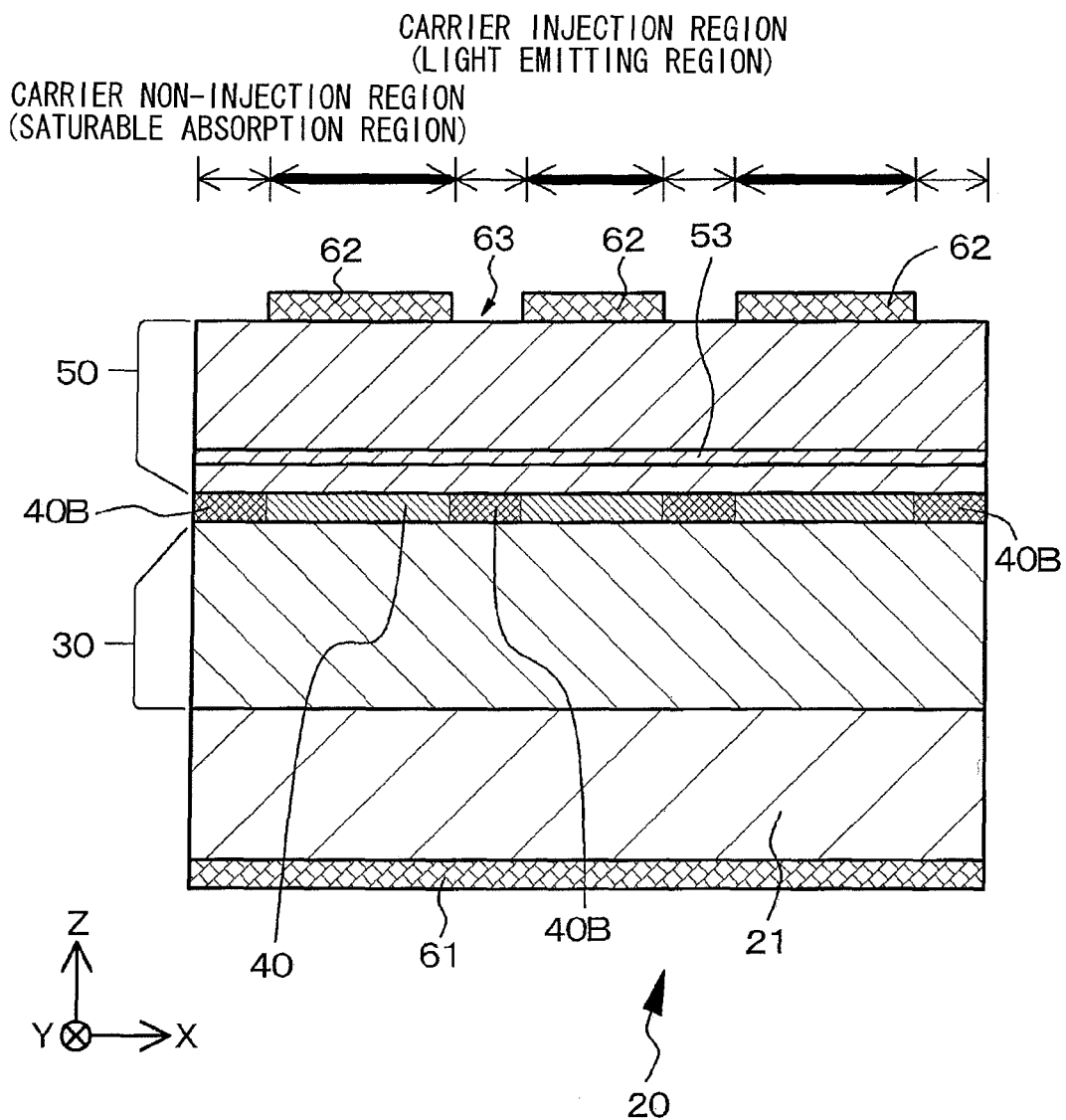
FIG. 7 is a schematic cross sectional view of another modified example of the laser diode device of the second embodiment where the laser diode device is cut along a virtual plane including the direction in which the resonator is extended.

The laser diode device illustrated in FIG. 7 is also a modification of the laser diode device illustrated in FIG. 5. In the laser diode device, N pieces (in this case, N=4) of the carrier non-injection region and (N−1) pieces of the carrier injection region are provided, and the carrier non-injection regions sandwich the carrier injection region. Otherwise, N pieces (=4) of the saturable absorption region and (N−1) piece of the light emitting region are provided, and the saturable absorption regions sandwich the light emitting region.

Figure 8:
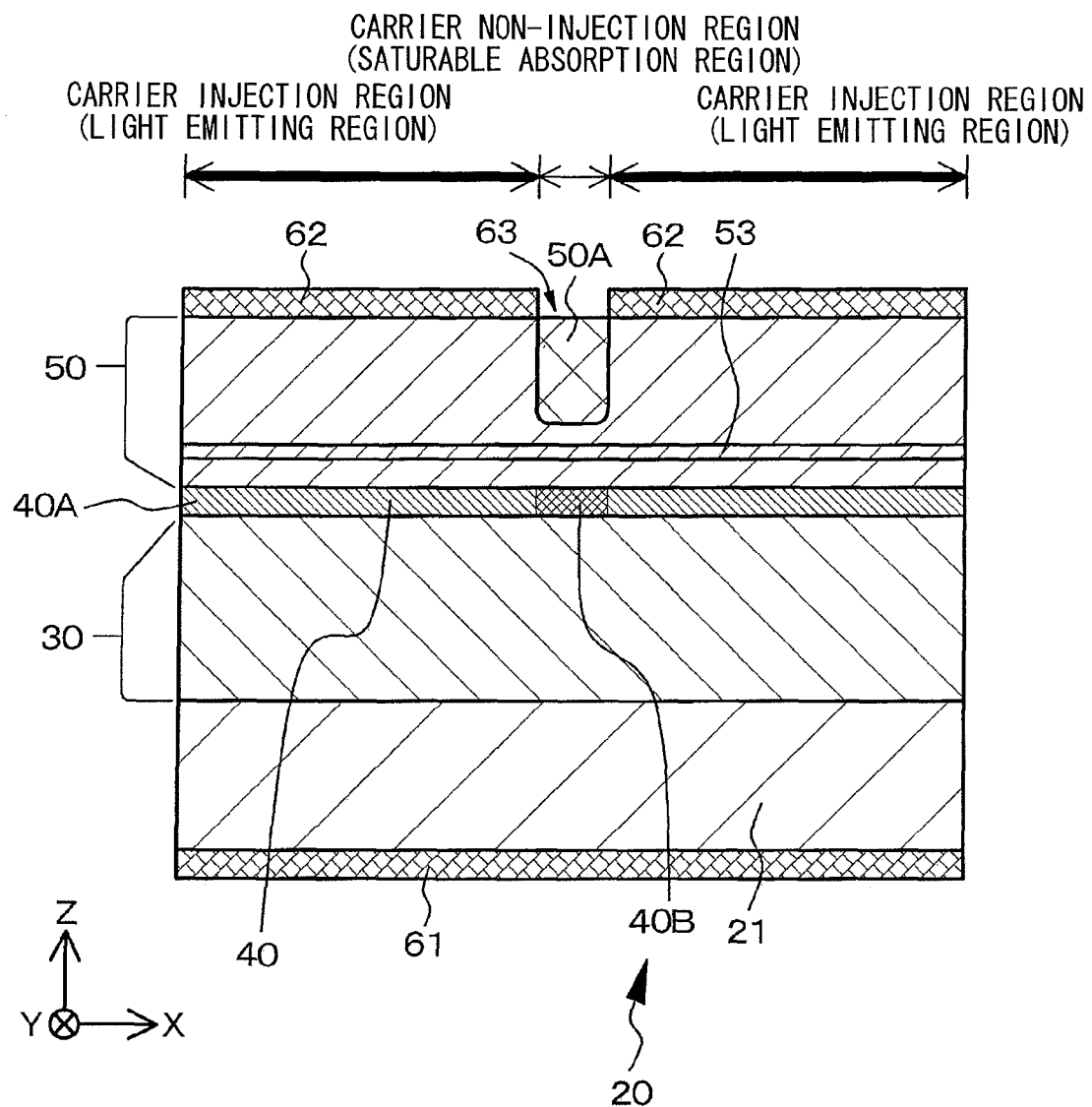
FIG. 8 is a schematic cross sectional view of a modified example of the laser diode device of the second embodiment illustrated in FIG. 5 where the laser diode device is cut along a virtual plane including the direction in which the resonator is extended.
Figure 9:
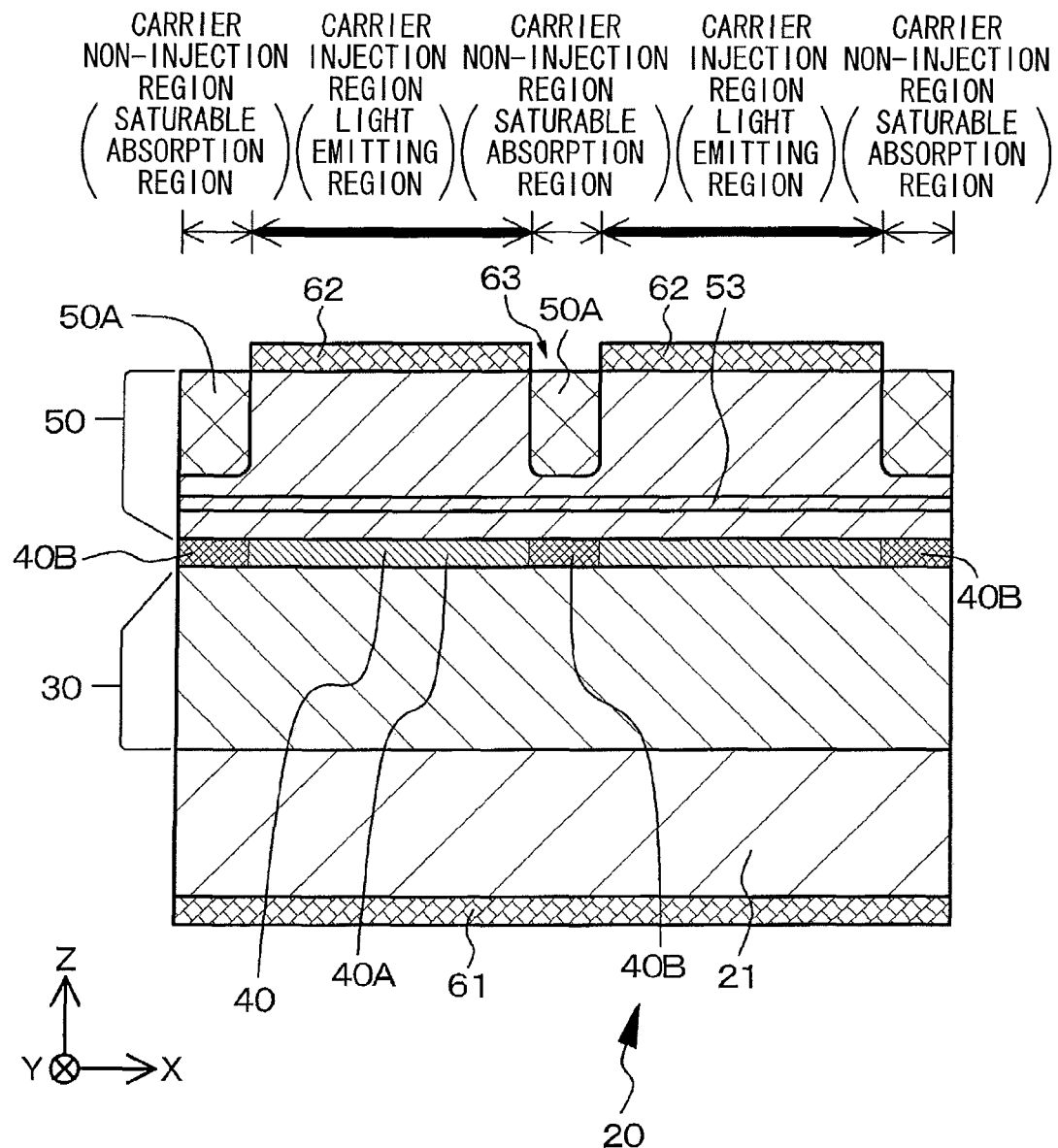
FIG. 9 is a schematic cross sectional view of a modified example of the laser diode device of the second embodiment illustrated in FIG. 6 where the laser diode device is cut along a virtual plane including the direction in which the resonator is extended.
Figure 10:
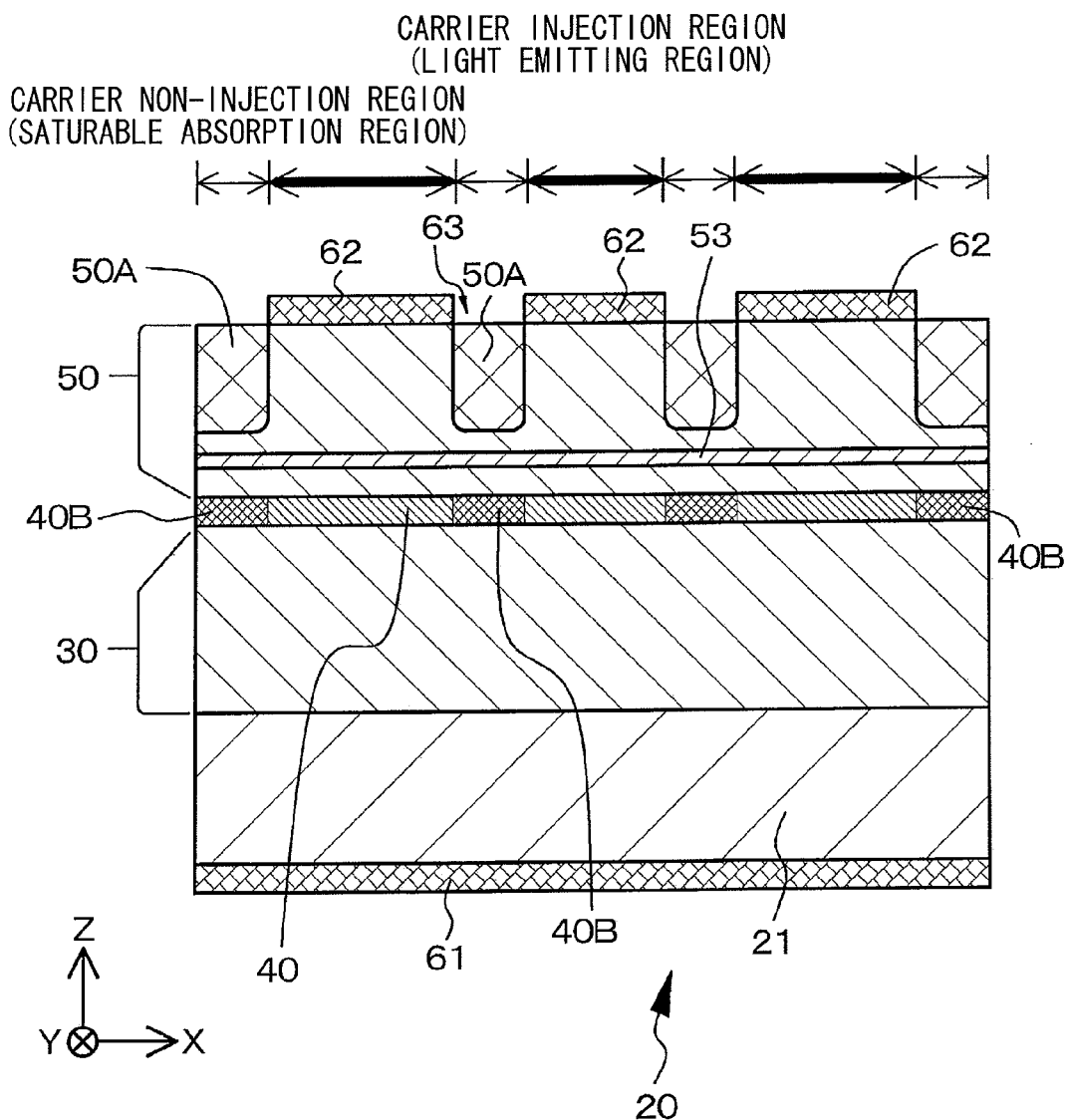
FIG. 10 is a schematic cross sectional view of a modified example of the laser diode device of the second embodiment illustrated in FIG. 7 where the laser diode device is cut along a virtual plane including the direction in which the resonator is extended.

The laser diode devices illustrated in FIG. 8, FIG. 9, and FIG. 10 are modifications of the laser diode devices illustrated in FIG. 5, FIG. 6, and FIG. 7. In these laser diode devices, ion such as boron (B), aluminum (Al), and silicon (Si) is injected into the section of the second compound semiconductor layer 50 positioned above the carrier non-injection region or into the section of the second compound semiconductor layer 50 positioned above the saturable absorption region 40B to form the high resistance region 50A, and thereby a current flown into the saturable absorption region 40B is more surely limited (inhibited).

Third Embodiment

The third embodiment is also a modified embodiment of the first embodiment, and further relates to the third structure laser diode device. In the third embodiment, as a schematic cross sectional view of a laser diode device cut along a virtual perpendicular plane (XZ plane) including the resonator direction in FIG. 11, the second electrode is separated into a first section 62A and a second section 62B by the separation trench 63. The width of the separation trench is 20 µm. In the example illustrated in FIG. 11, two first sections 62A of the second electrode sandwich one second section 62B of the second electrode.

In the third embodiment, N pieces (in the third embodiment, N=2) of the carrier injection region and (N−1) pieces of the carrier non-injection region are provided, and the carrier injection regions sandwich the carrier non-injection region. Otherwise, N pieces of the light emitting region (gain region) 40A and (N−1) piece of the saturable absorption region 40B are provided, and the light emitting regions 40A sandwich the saturable absorption region 40B. The entire length of the second electrode is shorter than the length of the active layer.

An electric resistance value between the first section 62A and the second section 62B of the second electrode 62 (in some cases, referred to as "separating resistance value") is $1*10$ or more times as large as an electric resistance value between the second electrode 62 and the first electrode 61, and specifically $1.5*10^3$ or more times as large as the electric resistance value between the second electrode 62 and the first electrode 61. Further, the electric resistance value (separating resistance value) between the first section 62A and the second section 62B of the second electrode 62 is $1*10^2 \Omega$ or more, and specifically $1.5*10^4 \Omega$.

In the laser diode device of the third embodiment, while a pulse current or a pulse voltage is applied to the first section 62A of the second electrode, a current is flown into the second section 62B of the second electrode or a voltage is applied to the second section 62B of the second electrode. Thereby, electric field is applied to the saturable absorption region 40B. A pulse current or a pulse voltage coincided with the pulse current or the pulse voltage applied to the first section of the second electrode may be applied to the second section 62B of the second electrode, or direct current bias may be applied. The voltage applied to the second section 62B of the second electrode may be forward bias or reverse bias. The voltage applied to the first section 62A of the second electrode is higher than the voltage applied to the second section 62B of the second electrode. By appropriately controlling the second section 62B of the second electrode, carrier of the saturable absorption region 40B is able to be flown into the light emitting region 40A at the time of high current injection, Q switch effect is largely increased, and the peak power is able to be further increased.

It is preferable that the second electrode 62 having a separating resistance value of $1*10^2 \Omega$ or more is formed on the second compound semiconductor layer 50. Differently from the existing GaAs laser diode device, in the case of a GaN laser diode device, mobility in the compound semiconductor having p-type conductivity type is small. Thus, resistance of the second compound semiconductor layer 50 having p-type conductivity type is not increased by ion injection or the like. By separating the second electrode 62 formed thereon by the separation trench 63, the electric resistance value between the first section 62A and the second section 62B of the second electrode 62 is able to be 10 or more times as large as the electric resistance value between the second electrode 62 and the first electrode 61, or the electric resistance value between the first section 62A and the second section 62B of the second electrode 62 is able to be $1*10^2 \Omega$ or more.

The second electrode 62 desirably has the following characteristics.
1. The second electrode 62 has a function as an etching-use mask for etching the second compound semiconductor layer 50.
2. The second electrode 62 is available for wet etching without deteriorating optical characteristics and electric characteristics of the second compound semiconductor layer 50.
3. In the case where the second electrode 62 is formed on the second compound semiconductor layer 50, a contact ratio resistance value of $10^{-2}$ $\Omega cm^2$ or less is shown.
4. In the case of a laminated structure, a material composing the lower layer metal layer is a material that has a large work function, shows a low contact ratio resistance value to the second compound semiconductor layer 50, and is available for wet etching.
5. In the case of a laminated structure, a material composing the upper layer metal layer is a material that is resistant to etching in forming the ridge structure (for example, $Cl_2$ gas used in RIE method), and is available for wet etching.

In the third embodiment, the second electrode 62 is composed of a Pd single layer having a thickness of 0.1 μm.

A fundamental composition and a fundamental structure of the laser diode device of the third embodiment are able to be similar to the composition and the structure of the laser diode device of the first embodiment except that the structure of the second electrode 62 is different, and thus detailed description will be omitted. Further, a method of driving a laser diode device and a laser diode apparatus of the third embodiment are able to be similar to the method of driving a laser diode device and the laser diode apparatus of the first embodiment, and thus detailed description will be omitted.

A description will be hereinafter given of a modified example of the laser diode device of the third embodiment with reference to FIG. 12 and FIG. 13 as a schematic cross sectional view of the laser diode device cut along a virtual perpendicular plane (XZ plane) including the resonator direction.

Figure 12:
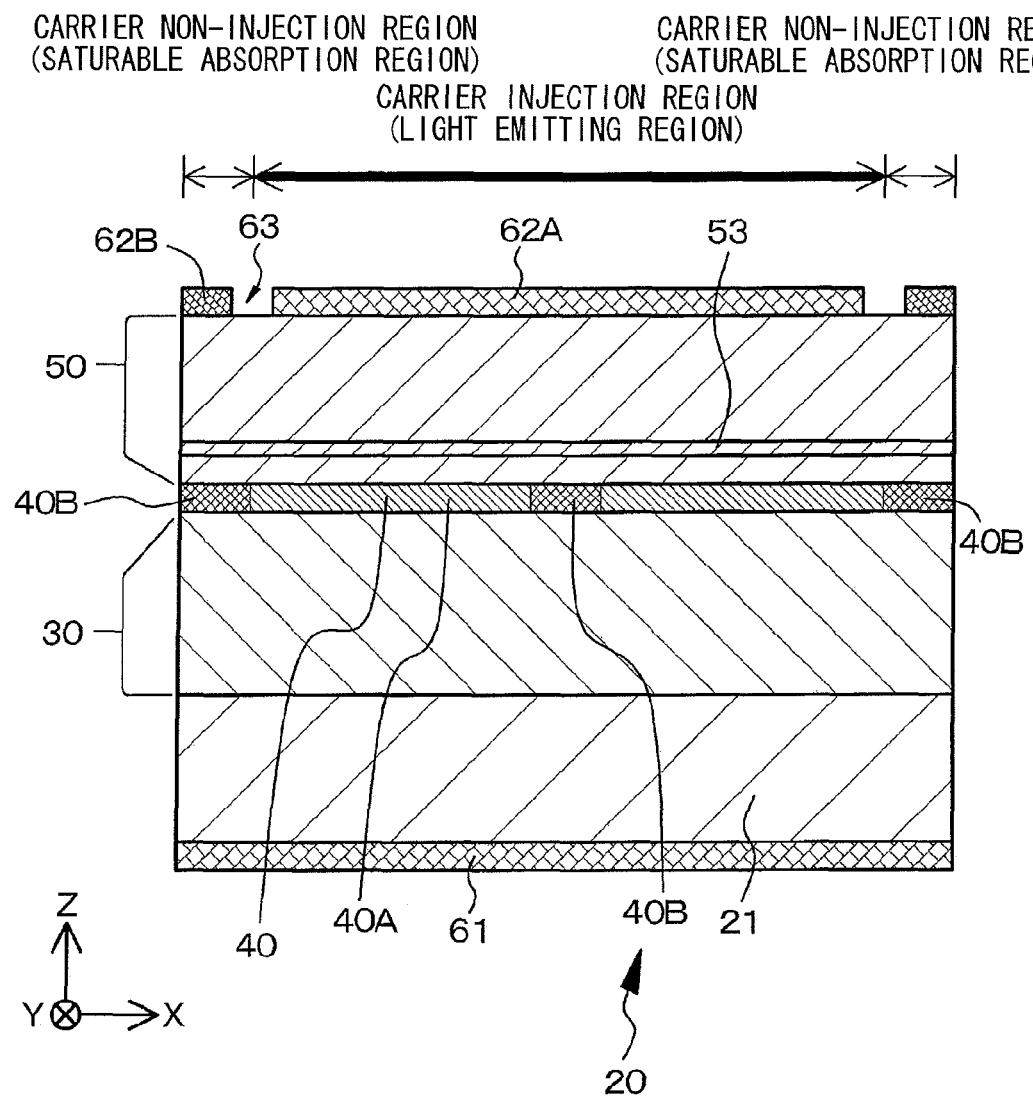
FIG. 12 is a schematic cross sectional view of a modified example of the laser diode device of the third embodiment where the laser diode device is cut along a virtual plane including the direction in which the resonator is extended.
Figure 13:
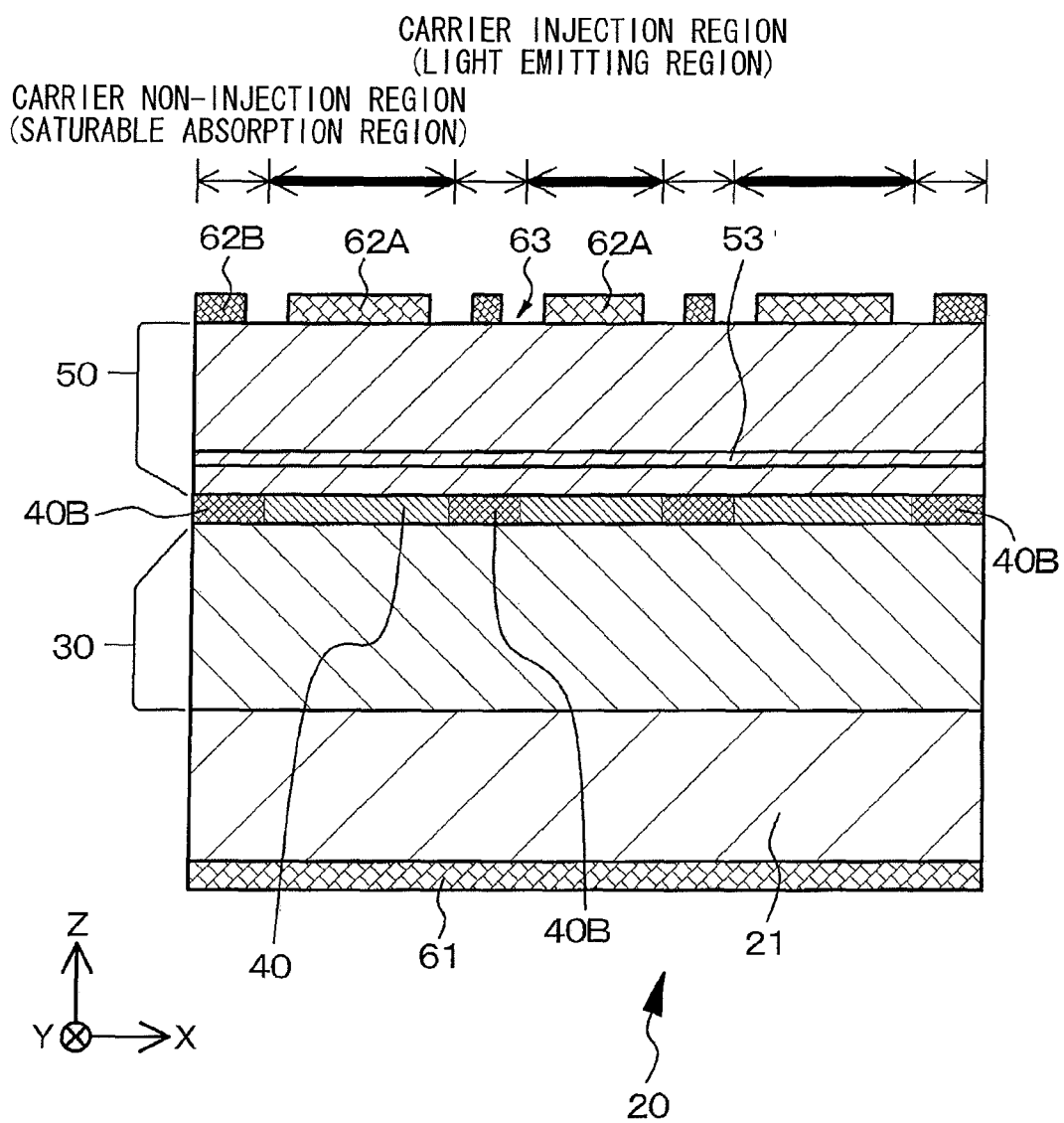
FIG. 13 is a schematic cross sectional view of another modified example of the laser diode device of the third embodiment where the laser diode device is cut along a virtual plane including the direction in which the resonator is extended.

In the laser diode device illustrated in FIG. 12, two second sections 62B of the second electrode sandwich one first section 62A. In the laser diode device illustrated in FIG. 13, four second sections 62B of the second electrode and three first sections 62A are provided. The second sections 62B sandwich the first section 62A. In these cases, N pieces of the carrier non-injection region and (N-1) pieces of the carrier injection region are provided, and the carrier non-injection regions sandwich the carrier injection region. Otherwise, N pieces of the saturable absorption region and (N-1) piece of the light emitting region are provided, and the saturable absorption regions sandwich the light emitting region. The entire length of the second electrode is shorter than the length of the active layer.

Figure 19:
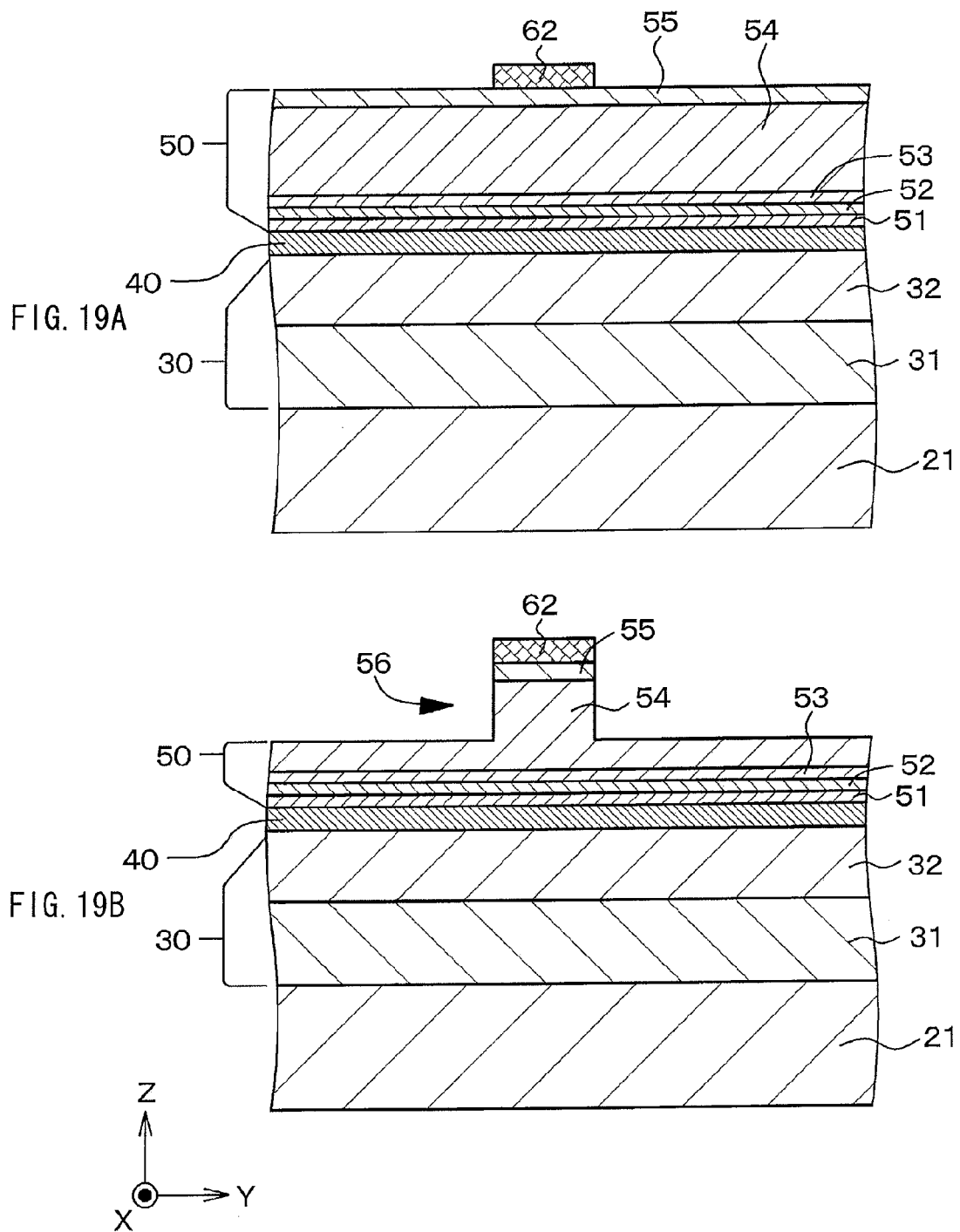
FIGS. 19A and 19B are schematic partial cross sectional views of the substrate and the like for explaining the method of manufacturing the laser diode device of the third embodiment following FIG. 18B.
Figure 20:
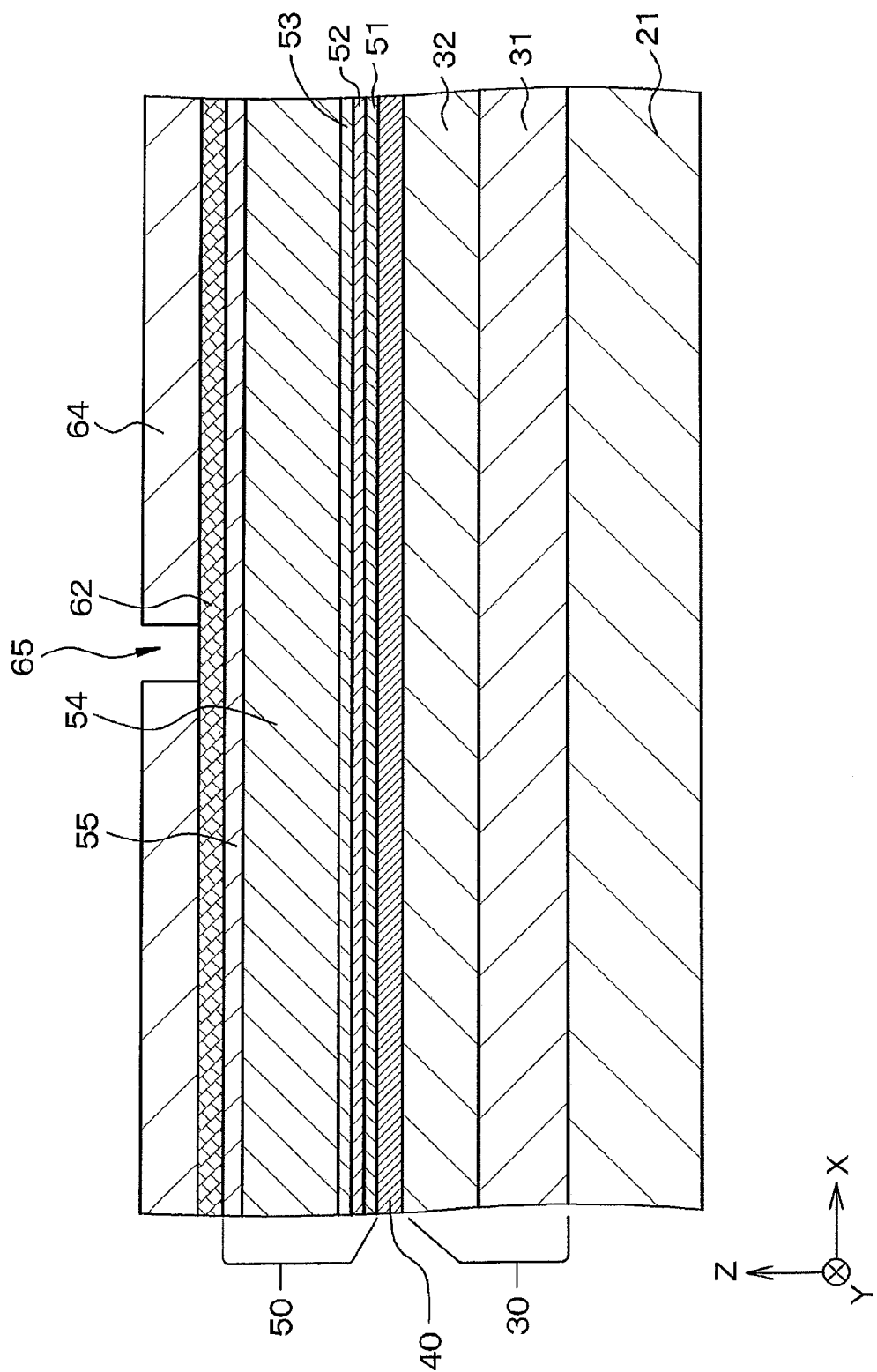
FIG. 20 is a schematic partial cross sectional view of the substrate and the like for explaining the method of manufacturing the laser diode device of the third embodiment following FIG. 19B.

A description will be given of a method of manufacturing a laser diode device of the third embodiment with reference to FIGS. 18A, 18B, 19A, 19B, and 20. FIGS. 18A, 18B, 19A, and 19B are a schematic partial cross sectional view where a substrate or the like is cut along YZ plane. FIG. 20 is a schematic partial end view where the substrate or the like is cut along XZ plane.

Step—300

Figure 18:
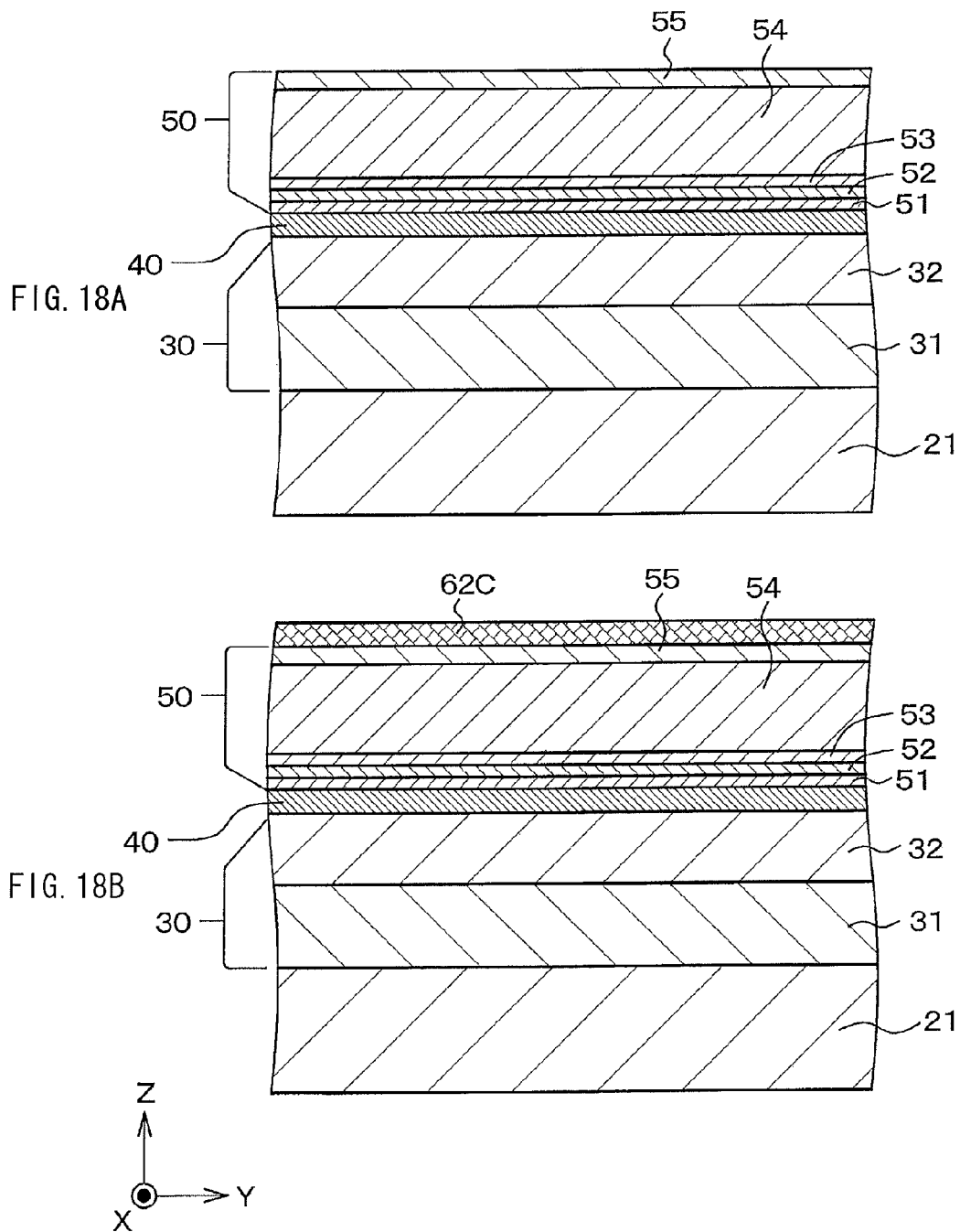
FIGS. 18A and 18B are schematic partial cross sectional views of a substrate and the like for explaining a method of manufacturing the laser diode device of the third embodiment.

First, a laminated structure in which the first compound semiconductor layer 30 that has first conductivity type (n-type conductivity type) and is composed of GaN compound semiconductor, the active layer 40 composed of GaN compound semiconductor including the light emitting region (gain region) 40A and the saturable absorption region 40B, and the second compound semiconductor layer 50 that has second conductivity type (p-type conductivity type) different from the first conductivity type and is composed of GaN compound semiconductor are sequentially layered is formed on (0001) plane of the n-type GaN substrate 21 based on known MOCVD method (refer to FIG. 18A).

Step—310

After that, the strip-shaped second electrode 62 is formed on the second compound semiconductor layer 50. Specifically, after a Pd layer 62C is formed over the entire face of the second compound semiconductor layer 50 based on vacuum evaporation method (refer to FIG. 18B), a strip-shaped etching resist layer is formed on the Pd layer 62C based on photolithography technology. After the Pd layer 62C not covered with an etching-use resist layer is removed by using nitro hydrochloric acid, the etching-use resist layer is removed. Thereby, the structure illustrated in FIG. 19A is able to be obtained. It is possible that the strip-shaped second electrode 62 is formed on the second compound semiconductor layer 50 based on liftoff method.

Step—320

Next, part of the second compound semiconductor layer 50 is etched with the use of the second electrode 62 as an etching-use mask to form the ridge structure. Specifically, part of the second compound semiconductor layer 50 is etched with the use of the second electrode 62 as an etching-use mask based on RIE method using $Cl_2$ gas. Thereby, the structure illustrated in FIG. 19B is able to be obtained. As described above, the ridge structure is formed by self alignment method by using the second electrode 62 patterned in the shape of a strip as an etching-use mask. Thus, misalignment is not generated between the second electrode 62 and the ridge structure.

Step—330

Figure 11:
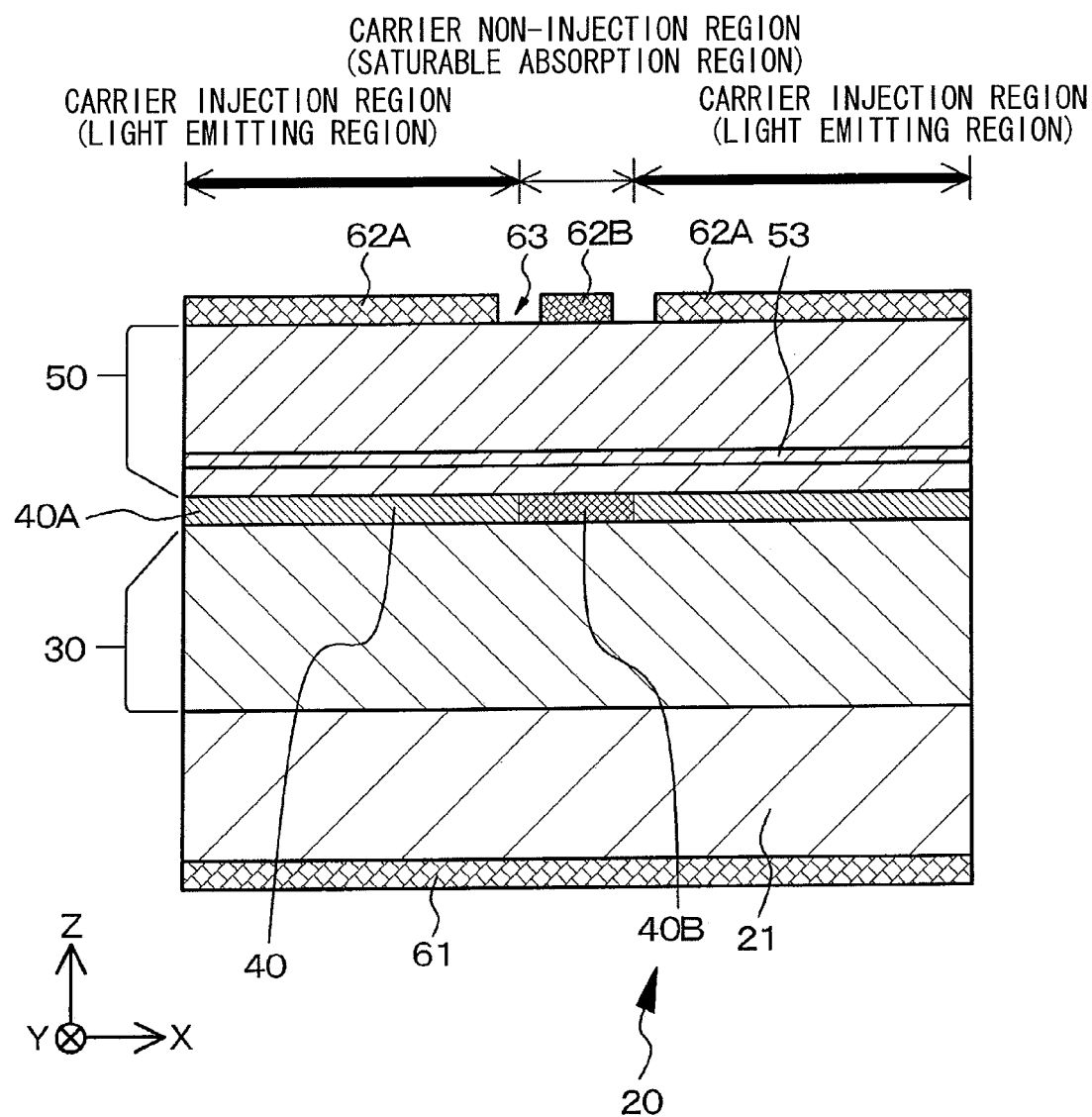
FIG. 11 is a schematic cross sectional view of a laser diode device of a third embodiment where the laser diode device is cut along a virtual plane including the direction in which the resonator is extended.

After that, a resist layer 64 for forming the separation trench 63 on the second electrode 62 is formed (refer to FIG. 20). Referential number 65 represents an aperture provided in the resist layer 64 for forming the separation trench 63. Next, the separation trench 63 is formed in the second electrode 62 by wet etching method with the use of the resist layer 64 as a wet etching-use mask, and thereby the second electrode 62 is separated into the first section 62A and the second section 62B by the separation trench 63. Specifically, nitro hydrochloric acid is used as an etching liquid, and the entire body is dipped into the nitro hydrochloric acid for about 10 seconds, and thereby the separation trench 63 is formed in the second electrode 62. After that, the resist layer 64 is removed. Accordingly, the structure illustrated in FIG. 11 is able to be obtained. As described above, differently from dry etching method, by adopting wet etching method, optical characteristics and electric characteristics of the second compound semiconductor layer 50 are not deteriorated. Thus, light emitting characteristics of the laser diode device are not deteriorated. If dry etching method is adopted, there is a possibility that internal loss $\alpha_i$ of the second compound semiconductor layer 50 is increased, the threshold voltage is increased, and light output is lowered. In this case, where an etching rate of the laminated structure is $ER_0$, and an etching rate of the second electrode 62 is $ER_1$, the following formula is established:

$$ER_0/ER_1 \leqq 1*10^2$$

As described above, since the high etching selection ratio exists between the second electrode 62 and the second compound semiconductor layer 50, the second electrode 62 is able to be surely etched without etching the laminated structure (or even if the laminated structure is etched, the etching amount is slight).

Step—340

After that, the n-side electrode is formed, the substrate is cleaved, and further packaging is made. Accordingly, the laser diode device is able to be fabricated.

As described above, in the method of manufacturing a laser diode device of the third embodiment, part of the second compound semiconductor layer is etched with the use of the strip-shaped second electrode as an etching-use mask to form the ridge structure. As described above, the ridge structure is formed by self alignment method by using the patterned second electrode as an etching-use mask. Thus, misalignment is not generated between the second electrode and the ridge structure. Further, the separation trench is formed in the second electrode by wet etching method. As described above, differently from dry etching method, by adopting wet etching method, deterioration of optical characteristics and electric characteristics of the second compound semiconductor layer is able to be inhibited. Thus, deterioration of light emitting characteristics of the laser diode device is able to be surely prevented.

Further, in the laser diode device of the third embodiment, the electric resistance value between the first section and the second section of the second electrode is 10 or more times as large as the electric resistance value between the second electrode and the first electrode, or $1*10^2\Omega$ or more. Thus, leak current flow from the first section to the second section of the second electrode is able to be surely inhibited. That is, a current injected into the light emitting region (gain region) is able to be increased, while concurrently, for example, a reverse bias voltage applied to the saturable absorption region is able to be increased. Thus, pulse laser light having stronger peak power is able to be outputted. Such a high electric resistance value between the first section and the second section of the second electrode is able to be attained only by separating the second electrode into the first section and the second section by the separation trench.

Descriptions have been hereinbefore given of the invention with reference to the preferred embodiments. However, the invention is not limited to the foregoing embodiments. The composition and the structure of the laser diode device and the composition of the laser diode apparatus described in the embodiments are just exemplified, and modifications may be made as appropriate. Further, in the embodiments, though various values have been shown, such various values are just exemplified as well, and thus it is needless to say that, for example, if specifications of a laser diode device to be used are changed, values are also changed. For example, in the third embodiment, the second electrode may have a laminated structure including a lower metal layer composed of palladium (Pd) having a thickness of 20 nm and an upper metal layer composed of nickel (Ni) having a thickness of 200 nm. In performing wet etching with the use of nitro hydrochloric acid, the etching rate of nickel is about 1.25 times as large as the etching rate of palladium.

The present application contains subject matter related to that disclosed in Japanese Priority Patent Application JP 2009-162617 filed in the Japanese Patent Office on Jul. 9, 2009, the entire contents of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A laser diode device comprising:
   A. a substrate;
   B. a laminated structure composed of a first compound semiconductor layer containing an n-type impurity, an active layer having a quantum well structure, and a second compound semiconductor layer containing a p-type impurity in this order proceeding from the substrate;
   C. a first electrode electrically under and connected to the first compound semiconductor layer; and
   D. a second electrode electrically on and connected to the second compound semiconductor layer,
   wherein,
      the second compound semiconductor layer has an electron barrier layer having a thickness of $1.5*10^{-8}$ m or more and an Mg concentration of $2*10^{19}$ cm$^{-3}$ or more,
      the second compound semiconductor layer has a superlattice structure comprised of upper and lower cladding layers and the electron barrier layer has a length substantially the same as the upper and lower cladding layers, the lower cladding layer being between the electron barrier layer and the active layer,
      a distance between facing surfaces of the active layer and the electron barrier layer is $8*10^{-8}$ m or less, and
      the laser diode emits laser light having at least 70 watt peak power when driven by a pulse current having a value of at least 10 times as large as a threshold current value of the laser diode.

2. The laser diode device according to claim 1, wherein the laser light has a wavelength of 405 nm.

3. The laser diode device according to claim 1, wherein the active layer is composed of a carrier injection region and a carrier non-injection region.

4. The laser diode device according to claim 1, wherein a length of the second electrode is shorter than a length of the active layer.

5. The laser diode device according to claim 1, wherein the second electrode is separated into a first section and a second section by a separation trench.

6. The laser diode device according to claim 1 having a ridge stripe type separate confinement heterostructure,
   wherein,
      a distance from a top face of a section of the second compound semiconductor layer positioned outside of both side faces of a ridge section to the active layer is $1.0*10^{-7}$ m or more.

7. The laser diode device according to claim 1, wherein the laminated body comprises an AlGaInN compound semiconductor.

8. The laser diode device according to claim 7, wherein:
   the superlattice structure has alternately arranged p-type GaN and p-type AlGaN layers,
   the electron barrier layer is composed of a p-type AlGaN, the upper and lower cladding layers are composed of a p-type GaN; and an Al composition ratio in the electron barrier layer is higher than an Al average composition ratio in the upper and lower cladding layers.

9. The laser diode device of claim 1, wherein the distance between the facing surfaces of the electron barrier layer and the active layer is 40 nm.

10. The laser diode of claim 1, wherein:
the upper cladding layer has a ridge section, and the second electrode overlies the ridge section such that a top and sidewalls of the ridge section are covered by the second electrode.

11. The laser diode device of claim 1, wherein the thickness of the electron barrier layer is 30 nm.

12. The laser diode device of claim 1, wherein the first compound semiconductor layer comprises first and second cladding layers, the first cladding layer made of n-type GaN, the second cladding layer made of n-type AlGaN.

13. The laser diode device of claim 1, wherein:
a beam radiation half-value angle $\theta^{\perp}$ in the vertical direction of laser light output from an end face of the laser diode device is 25 deg. or less,
a resonant length of the laser diode device is 0.3 mm to 2 mm both inclusive,
a bandgap of a well layer in the quantum well structure is 2.4 eV or more.

14. A laser diode apparatus including a pulse generator and a laser diode device driven by a drive pulse from the pulse generator,
wherein the laser diode device comprises:
A. a substrate;
B. a laminated structure composed of a first compound semiconductor layer containing an n-type impurity, an active layer having a quantum well structure, and a second compound semiconductor layer containing a p-type impurity in this order proceeding from the substrate;
C. a first electrode electrically connected to the first compound semiconductor layer; and
D. a second electrode electrically connected to the second compound semiconductor layer and
wherein:
the second compound semiconductor layer has an electron barrier layer having a thickness of $1.5*10^{-8}$ m or more and an Mg concentration of $2*10^{19}$ cm$^{-3}$ or more,
the second compound semiconductor layer has a superlattice structure comprised of upper and lower cladding layers and the electron barrier layer has a length substantially the same as the upper and lower cladding layers, the lower cladding layer being between the electron barrier layer and the active layer,
a distance between facing surfaces of the active layer and the electron barrier layer is $8*10^{-8}$ m or less, and
the laser diode emits laser light having at least 70 watt peak power when driven by a pulse current having a value of at least 10 times as large as a threshold current value of the laser diode.

15. The laser diode apparatus of claim 14, wherein:
the upper cladding layer has a ridge section, and
the second electrode overlies the ridge section such that a top and sidewalls of the ridge section are covered by the second electrode.

16. The laser diode apparatus of claim 14, wherein the first compound semiconductor layer comprises first and second cladding layers, the first cladding layer made of n-type GaN, the second cladding layer made of n-type AlGaN.

17. The laser diode apparatus of claim 14, wherein:
a beam radiation half-value angle $\theta^{\perp}$ in the vertical direction of laser light output from an end face of the laser diode device is 25 deg. or less,
a resonant length of the laser diode device is 0.3 mm to 2 mm both inclusive,
a bandgap of a well layer in the quantum well structure is 2.4 eV or more.

18. A laser diode device comprising:
A. a substrate;
B. a laminated structure composed of a first compound semiconductor layer containing an n-type impurity, an active layer having a quantum well structure, and a second compound semiconductor layer containing a p-type impurity in this order proceeding from the substrate;
C. a first electrode electrically connected to the first compound semiconductor layer; and
D. a second electrode electrically connected to the second compound semiconductor layer,
wherein,
the second compound semiconductor has an electron barrier layer with a thickness of $1.5*10^{-8}$ m or more and an Mg concentration of $2*10^{19}$ cm$^{-3}$ or more,
the second compound semiconductor layer has a superlattice structure comprised of upper and lower cladding layers and the electron barrier layer has a length substantially the same as the upper and lower cladding layers, the lower cladding layer being between the electron barrier layer and the active layer,
the upper cladding layer has a ridge section,
the second electrode overlies the ridge section such that a top and sidewalls of the ridge section are covered by the second electrode,
a distance between facing surfaces of the active layer and the electron barrier layer is $8*10^{-8}$ m or less,
a distance from a top face of a section of the second compound semiconductor layer positioned outside of both side faces of a ridge section to the active layer is $1.0*10^{-7}$ m or more,
the superlattice structure has alternately arranged p-type GaN and p-type AlGaN layers,
the electron barrier layer is composed of a p-type AlGaN,
the upper and lower cladding layers are composed of a p-type GaN, and
an Al composition ratio in the electron barrier layer is higher than an Al average composition ratio in the cladding layer, and
the laser diode emits laser light with a wavelength of 405 nm and having at least 70 watt peak power when driven by a pulse current having a value of at least 10 times as large as a threshold current value of the laser diode.

19. The laser diode device of claim 18, wherein the first compound semiconductor layer comprises first and second cladding layers, the first cladding layer made of n-type GaN, the second cladding layer made of n-type AlGaN.

20. The laser diode device of claim 18, wherein
a beam radiation half-value angle $\theta^{\perp}$ in the vertical direction of laser light output from an end face of the laser diode device is 25 deg. or less,
a resonant length of the laser diode device is 0.3 mm to 2 mm both inclusive,
a bandgap of a well layer in the quantum well structure is 2.4 eV or more.

* * * * *